(12) United States Patent
Suzuki

(10) Patent No.: US 7,586,780 B2
(45) Date of Patent: *Sep. 8, 2009

(54) SEMICONDUCTOR MEMORY DEVICE

(75) Inventor: Toshikazu Suzuki, Hyogo (JP)

(73) Assignee: Panasonic Corporation, Osaka (JP)

( * ) Notice: Subject to any disclaimer, the term of this patent is extended or adjusted under 35 U.S.C. 154(b) by 8 days.

This patent is subject to a terminal disclaimer.

(21) Appl. No.: 11/958,800

(22) Filed: Dec. 18, 2007

(65) Prior Publication Data

US 2008/0151604 A1 Jun. 26, 2008

(30) Foreign Application Priority Data

Dec. 18, 2006 (JP) ............................. 2006-340193
Dec. 5, 2007 (JP) ............................. 2007-314393

(51) Int. Cl.
*G11C 7/00* (2006.01)
(52) U.S. Cl. ...................... 365/154; 365/205
(58) Field of Classification Search ................. 365/154, 365/205
See application file for complete search history.

(56) References Cited

U.S. PATENT DOCUMENTS

| 4,310,900 A | 1/1982 | Tsujide |
| 6,473,334 B1 | 10/2002 | Bailey et al. |
| 2002/0020885 A1* | 2/2002 | Rockett ...................... 257/369 |
| 2003/0227789 A1* | 12/2003 | Lien et al. ..................... 365/49 |
| 2005/0152199 A1* | 7/2005 | Park et al. ................... 365/222 |
| 2007/0041239 A1 | 2/2007 | Takeda |
| 2007/0139997 A1* | 6/2007 | Suzuki et al. ............... 365/154 |

OTHER PUBLICATIONS

Ohbayashi, S., et al., "A 65 nm SoC Embedded 6T-SRAM Design for Manufacturing with Read and Write Cell Stabilizing Circuits", 2006 Symposium on VLSI Circuits Digest of Technical Papers, 2006, pp. 20-21, IEEE.

* cited by examiner

*Primary Examiner*—Michael T Tran
(74) *Attorney, Agent, or Firm*—McDermott Will Emery LLP

(57) ABSTRACT

In a semiconductor memory device including memory cells each having two inverters connected in a cross-coupled configuration to hold High data and Low data as a pair and two access transistors, a plurality of word lines, and a plurality of bit lines, the potential of the selected one of the plurality of word lines is controlled to be lower than a potential obtained by adding up the potential of one of Low-data-holding power sources each for holding the Low data at any time other than during a read operation and the threshold voltage of each of the access transistors.

33 Claims, 12 Drawing Sheets

(External Power Source Voltage)
· Vdd=0.9V
· Vss=0.0V
· VGND=0.3V
(Transistor Threshold Voltages)
· Logic Transistor: 0.3V
· Memory Cell Transistor: 0.2V During Write Operation

|  | Selected Column | | Non-Selected Column | |
| --- | --- | --- | --- | --- |
|  | Selected WL | Non-Selected WL | Selected WL | Non-Selected WL |
| VDDM | 0.6V | 0.6V | 0.6V | 0.6V |
| VSSM | 0.3V | 0.3V | 0.3V | 0.3V |
| WL | 0.5V | 0.0V | 0.5V | 0.0V |
| BL | 0.0V | 0.0V | 0.5V | 0.5V |
| BLX | 0.6V | 0.6V | 0.6V | 0.6V |

During Read Operation

|  | Selected Column | | Non-Selected Column | |
| --- | --- | --- | --- | --- |
|  | Selected WL | Non-Selected WL | Selected WL | Non-Selected WL |
| VDDM | 0.6V | 0.6V | 0.6V | 0.6V |
| VSSM | 0.0V | 0.0V | 0.3V | 0.3V |
| WL | 0.5V | 0.0V | 0.5V | 0.0V |
| BL | 0.6V | 0.6V | 0.6V | 0.6V |
| BLX | 0.6V | 0.6V | 0.6V | 0.6V |

FIG. 4

(External Power Source Voltage)
· Vdd=1.1V
· Vss=0.0V
· VGND=0.5V (Transistor Threshold Voltages)
· Logic Transistor: 0.3V
· Memory Cell Transistor: 0.3V During Write Operation

|  | Selected Column | | Non-Selected Column | |
|---|---|---|---|---|
|  | Selected WL | Non-Selected WL | Selected WL | Non-Selected WL |
| VDDM | 1.1V | 1.1V | 1.1V | 1.1V |
| VSSM | 0.5V | 0.5V | 0.5V | 0.5V |
| WL | 0.5V | 0.0V | 0.5V | 0.0V |
| BL | 0.0V | 0.0V | 1.1V | 1.1V |
| BLX | 1.1V | 1.1V | 1.1V | 1.1V |

During Read Operation

|  | Selected Column | | Non-Selected Column | |
|---|---|---|---|---|
|  | Selected WL | Non-Selected WL | Selected WL | Non-Selected WL |
| VDDM | 1.1V | 1.1V | 1.1V | 1.1V |
| VSSM | 0.0V | 0.0V | 0.5V | 0.0V |
| WL | 0.5V | 0.0V | 0.5V | 0.0V |
| BL | 1.1V | 1.1V | 1.1V | 1.1V |
| BLX | 1.1V | 1.1V | 1.1V | 1.1V |

FIG. 6

(External Power Source Voltage)
- Vdd=1.1V
- Vss=0.0V
- VGND=0.5V (Transistor Threshold Voltages)
- Logic Transistor: 0.3V
- Memory Cell Transistor: 0.2V During Write Operation

|  | Selected Column | | Non-Selected Column | |
|---|---|---|---|---|
|  | Selected WL | Non-Selected WL | Selected WL | Non-Selected WL |
| VDDM | 0.8V | 0.8V | 0.8V | 0.8V |
| VSSM | 0.5V | 0.5V | 0.5V | 0.5V |
| WL | 0.5V | 0.0V | 0.5V | 0.0V |
| BL | 0.0V | 0.0V | 0.5V | 0.5V |
| BLX | 0.5V | 0.5V | 0.5V | 0.5V |

During Read Operation

|  | Selected Column | | Non-Selected Column | |
|---|---|---|---|---|
|  | Selected WL | Non-Selected WL | Selected WL | Non-Selected WL |
| VDDM | 0.8V | 0.8V | 0.8V | 0.8V |
| VSSM | 0.0V | 0.0V | 0.5V | 0.5V |
| WL | 0.5V | 0.0V | 0.5V | 0.0V |
| BL | 0.5V | 0.5V | 0.5V | 0.5V |
| BLX | 0.5V | 0.5V | 0.5V | 0.5V |

FIG. 11

(External Power Source Voltage)
- Vdd=0.9V
- Vss=0.0V
- VGND=0.3V (Transistor Threshold Voltages)
- Logic Transistor: 0.3V
- Memory Cell Transistor: 0.2V During Write Operation

|  | Selected Column | | Non-Selected Column | |
|---|---|---|---|---|
|  | Selected WL | Non-Selected WL | Selected WL | Non-Selected WL |
| VDDM | 0.6V | 0.6V | 0.6V | 0.6V |
| VSSM | 0.3V | 0.3V | 0.3V | 0.3V |
| WL | 0.5V | 0.0V | 0.5V | 0.0V |
| BL | 0.0V | 0.0V | 0.5V | 0.5V |
| BLX | 0.6V | 0.6V | 0.6V | 0.6V |

During Read Operation

|  | Selected Column | | Non-Selected Column | |
|---|---|---|---|---|
|  | Selected WL | Non-Selected WL | Selected WL | Non-Selected WL |
| VDDM | 0.6V | 0.6V | 0.6V | 0.6V |
| VSSM | 0.0V | 0.0V | 0.3V | 0.3V |
| WL | 0.5V | 0.0V | 0.5V | 0.0V |
| BL | 0.6V | 0.6V | 0.6V | 0.6V |
| BLX | 0.6V | 0.6V | 0.6V | 0.6V |

FIG. 14

(External Power Source Voltage)
- Vdd=1.1V
- Vss=0.0V (Transistor Threshold Voltages)
- Logic Transistor: 0.3V
- Memory Cell Transistor: 0.4V During Write Operation

|  | Selected Column | | Non-Selected Column | |
|---|---|---|---|---|
|  | Selected WL | Non-Selected WL | Selected WL | Non-Selected WL |
| VDDM | 0.7V | 0.7V | 1.1V | 1.1V |
| VSSM | 0.0V | 0.0V | 0.0V | 0.0V |
| WL | 1.0V | 0.0V | 1.0V | 0.0V |
| BL | 0.0V | 0.0V | 1.1V | 1.1V |
| BLX | 1.1V | 1.1V | 1.1V | 1.1V |

During Read Operation

|  | Selected Column | | Non-Selected Column | |
|---|---|---|---|---|
|  | Selected WL | Non-Selected WL | Selected WL | Non-Selected WL |
| VDDM | 1.1V | 1.1V | 1.1V | 1.1V |
| VSSM | 0.0V | 0.0V | 0.0V | 0.0V |
| WL | 1.0V | 0.0V | 1.0V | 0.0V |
| BL | 1.1V | 1.1V | 1.1V | 1.1V |
| BLX | 1.1V | 1.1V | 1.1V | 1.1V |

SEMICONDUCTOR MEMORY DEVICE

BACKGROUND OF THE INVENTION

1. Field of the Invention

The present invention relates to a semiconductor memory device comprising flip-flop memory cells.

2. Description of the Prior Art

With the recent process miniaturization, there have been rapidly growing tendencies toward a smaller-area semiconductor integrated circuit and a lower power source voltage. Under the adverse effects thereof, in a semiconductor memory device comprising flip-flop memory cells such as, e.g., a static random access memory (SRAM), it has become extremely difficult to design a memory cell having stable characteristics due to variations in the characteristics of individual transistors composing the memory cell and the lower power source voltage. As a result, a lower production yield of the semiconductor memory device resulting from the degraded operation margins of the memory cell has presented a problem.

The operation margins of the memory cell mentioned herein include a write margin showing the ease of writing during data writing, a static noise margin which is a margin for noise during data reading or data holding, and a cell current showing a speed margin during data reading.

FIG. 12 is a view showing a memory cell 400 which is a typical flip-flop SRAM memory cell composed of CMOS transistors. In the memory cell 400 shown in FIG. 12, QN1 and QN2 denote drive transistors, QN3 and QN4 denote access transistors, QP1 and QP2 denote load transistors, WL denotes a word line, BL and BLX denote bit lines, VDDM denotes a High-data-holding power source (which will be described later), and VSS denotes a ground power source.

The load transistor QP1 and the drive transistor QN1 constitute an inverter, while the load transistor QP2 and the drive transistor QN2 constitute an inverter. The inverters have respective input/output terminals connected in a cross-coupled configuration to compose a flip-flop. The respective output terminals of the individual inverters are referred to herein as data storage nodes. A power source from which power is supplied to the respective sources of the load transistors QP1 and QP2 is referred to as the High-data-holding power source. A power source from which power is supplied to the drive transistors QN1 and QN2 is referred to as a Low-data-holding power source.

The respective gate terminals of the access transistors QN3 and QN4 are each connected to the same word line WL. The drain terminal of the access transistor QN3 is connected to the bit line BL, while the drain terminal of the access transistor QN4 is connected to the bit line BLX. The respective source terminals of the access transistors QN3 and QN4 are connected to the input/output terminals of the inverters mentioned above.

The writing of data to the SRAM memory cell of FIG. 12 is implemented by shifting the potential on either one of the bit lines BL and BLX which have been each precharged to a High level (H level) to a Low level (L level) from the H level in a state (referred to as an active state) where the word line WL has been shifted from the L level to the H level.

FIG. 13 shows a schematic view of a memory cell array in which the memory cells 400 are arranged on an array. Each of the memory cells in the memory cell array is accessed in each of row and column directions to be selected by selecting one of a plurality of bit-line selection circuits and one of a plurality of word line drivers, which are not shown. An arrangement of the memory cells in the column direction in which each of the bit lines is routed is referred to as a column.

A description will be given to characteristics related to the operation margins of each of the SRAM memory cells.

A margin during data writing is shown by the voltage of the bit line for performing writing to one of the memory cells. The operation of writing data to the SRAM memory cell is performed by inverting the state of the flip-flop composing the memory cell (it is to be noted that, when the same data as the data to be written has been stored in advance in the memory cell, the state of the flip-flop is not inverted). At this time, the critical potential of the bit line which allows the inversion of the state of the flip-flop of the memory cell is referred to as the write margin.

For example, when the write margin is low, the margin (static noise margin) for erroneous writing due to bit-line noise or the like increases. On the other hand, when the potential of the bit line has not reached a sufficiently low level, the flip-flop cannot be inverted.

Conversely, when the write margin is high, the time required for data writing is reduced, but the margin for erroneous writing (static noise margin) decreases.

A low write margin indicates that the state of the flip-flop composing the memory cell is immune to inversion due to the bit-line noise or the like during a read operation, i.e., the static noise margin increases. On the other hand, a high write margin indicates that the state of the flip-flop composing the memory cell is susceptible to inversion during a read operation, i.e., the static noise margin decreases.

When the potential on the word line WL is increased or the threshold of each of the drive transistors or the access transistors is lowered with the view to increasing the reading speed, data at the storage nodes of the flip-flop is more susceptible to the influence of the bit-line noise so that the static noise margin lowers.

There is also the cell current as a speed-related margin. The cell current is a current value in the selected memory cell when the drive transistor having a drain connected to the Low-data storage node discharges the bit line via the access transistor till it reaches the potential VSSM which is the source potential. As the cell current is larger, the speed of discharging the selected bit line is higher and the speed of amplifying the potential difference in the bit line pair and reading data is higher. However, when the cell current is increased by reducing the threshold of each of the memory cell transistors or increasing the word line potential, the susceptibility to the bit-line noise increases and the static noise margin decreases.

Thus, the write margin, the static noise margin, and the cell current (speed margin) have contradictory characteristics such that, when one of the characteristics is to be satisfied, the other characteristics decrease.

Because of the contradiction, it has been proposed to improve at least one of the characteristics. For example, a semiconductor memory device has been reported which is constructed such that the word line potential is lowered only slightly from the conventional power source potential in order to improve the static noise margin. For example, it has been attempted to slightly lower the word line potential from the power source potential to improve the static noise margin (see, e.g., 2006 Symposium on VLSI Circuits Digest of Technical Papers, pp. 20-21, which document will be hereinafter referred to as Non-Patent Document 1).

In addition, a semiconductor memory device has also been known which is constructed in order to satisfy only the write margin such that the High-data-holding power source of the memory cell is controlled to be lower during a write operation to provide an improved write margin (see, e.g., Japanese Laid-Open Patent Publication No. SHO 55-64686, which document will be hereinafter referred to as Patent Document 1).

FIG. 14 shows an example of potentials at the individual terminals of one of the memory cells when both of the techniques disclosed in Non-Patent Document 1 and Patent Document 1 shown above are used.

During a non-selection period, a potential Vdd (1.1 V), which is a power-source potential, is supplied to the High-data-holding power source VDDM of each of the memory cells and to the bit line pair (BL, BLX), while a potential Vss (0 V) is supplied to the Low-data-holding power source VSSM of the memory cell and to the word line (WL).

During a write operation, a potential (1.0 V) slightly lower than the potential Vdd is supplied to the word line (WL), while a potential (0.7 V) lower than the potential Vdd is supplied to each of the High-data-holding power sources in the selected column. Although data writing to the selected memory cell becomes difficult by thus slightly lowering the word line potential, the gate potential of each of the access transistors of the non-selected memory cells arranged in the row direction under the word line is lowered with the view to attempting to prevent data destruction by increasing the static noise margin of each of the non-selected memory cells even slightly, and then the power source potential of the selected column (in the column direction) is lowered to improve the write margin of the selected memory cell.

On the other hand, during a read operation, a potential (1.0 V) lower than the potential Vdd is supplied to the word line (WL) in the same manner as during the write operation, the bit line precharged in advance to the power source potential by the drive transistor connected to the Low-data storage node in the memory cell is discharged, and data is read by amplifying the potential difference produced between in bit line pair.

Although the gate potential of the access transistor is reduced and the cell current of the selected memory cell is lowered by thus slightly lowering the word line potential, it is attempted to increase the static noise margin of each of the non-selected memory cells under the selected word line even slightly and thereby prevent data destruction.

In general, when the threshold voltage of each of memory transistors is controlled to be higher than that of each of logic transistors other than the transistors of the memory cells as shown in FIG. 14, the stored data is less likely to be inverted in response to noise than in the case where transistors each having the same threshold voltage as the logic transistors are used for the memory cells. In other words, the static noise margin is thereby increased.

However, in a structure in which an improvement in static noise margin is attempted by lowering only the word line potential such as the semiconductor memory device disclosed in Non-Patent Document 1 shown above, a write operation to the memory cell is also to be performed with the same word line potential. As the word line potential is lowered, the static noise margin is more improved. However, there is the problem that data writing during a write operation becomes difficult, while the cell current during a read operation decreases to reduce the reading speed.

It is also expected that, as variations in the thresholds of transistors further increase with future process miniaturization, the static noise margin of the SRAM memory cell further decreases. To improve the static noise margin in accordance with the expectation, it is necessary to further lower the word line potential. However, when the word line potential is further lowered, the problem is encountered that the Low level cannot be written in the memory cell even if the bit line potential is lowered to 0 V during a write operation, while the reading speed is further reduced.

On the other hand, in a semiconductor memory device in which the High-data-holding power source voltage for the memory cell is controlled such as the semiconductor memory device disclosed in Patent Document 1 shown above, the write margin is improved but, when the High-data-holding power source voltage for the memory cell is controlled to be lower during data writing, the High-data-holding power source voltage for the non-selected memory cells in the same column is also reduced. As a result, the problem occurs that the power source voltage for holding data in the non-selected memory cells decreases to result in data destruction.

There is also the problem that, although the static noise margin is increased by increasing the threshold voltage of each of the memory cell transistors to a level higher than that of the threshold voltage of each of the logic transistors, the write margin and the cell current are conversely reduced by the increased threshold voltage.

In addition, to increase the threshold voltage, the process step of adjusting an impurity only for the threshold adjustment of the memory cells is necessary, which leads to the problem of higher process cost.

There is the further problem that, when the impurity in each of the memory cell transistors is increased to increase the threshold voltage thereof, variations in the threshold voltages of the transistors increase to reduce the operation margins of the memory cells.

Thus, in the conventional semiconductor memory device, when one of the operation margins of the SRAM memory cell is to be improved, the other operation margins deteriorate under the constraints of the tradeoff relations among the operation margins. This results in the problem that, to satisfy all of the operation margins, optimization design should be performed under operating conditions in an extremely narrow range.

That is, to optimize the word line potential, it is necessary to optimize the contradictory characteristics of: (1) static noise margin; (2) write margin; and (3) cell current. There is also the problem that, to obtain a margin during data writing, the contradictory characteristics of: (2) write margin; and (4) data holding voltage should be optimized.

There is the further problem that, as variations in the threshold voltages of transistors increase with future process miniaturization, a design range capable of satisfying these characteristics is further narrowed, and the design of the SRAM memory cell becomes difficult.

SUMMARY OF THE INVENTION

The present invention has been achieved by focusing attention on the problems described above and it is therefore an object of the present invention to provide a semiconductor memory device comprising flip-flop memory cells such as SRAMs which allows enlargement of the operation margins of the memory cells.

To solve the foregoing problems, an embodiment of the present invention is a semiconductor memory device including: a memory cell array having a plurality of memory cells arranged in a matrix of rows and columns; a plurality of word lines arranged to correspond to the respective rows of the memory cells; and a plurality of bit lines arranged to correspond to the respective columns of the memory cells, wherein each of the memory cells has two access transistors and two inverters connected in a cross-coupled configuration to hold High data and Low data as a pair, wherein the two access transistors have respective gates connected to the corresponding word lines, respective sources connected to the corresponding bit lines, and respective drains connected to respective outputs of the different inverters, each of the memory cells uses a potential of a High-data-holding power source for holding the High data as a first potential and uses a potential of a Low-data-holding power source for holding the Low data at any time other than a read operation as a second potential, and a potential of the selected one of the plurality of word lines is a fourth potential lower than a third potential obtained by adding up the second potential and a threshold voltage of each of the access transistors.

Another embodiment of the present invention is a semiconductor memory device including: a memory cell array having a plurality of memory cells arranged in a matrix of rows and columns; a plurality of word lines arranged to correspond to the respective rows of the memory cells; and a plurality of bit lines arranged to correspond to the respective columns of the memory cells, wherein each of the memory cells has two access transistors and two inverters connected in a cross-coupled configuration to hold High data and Low data as a pair, wherein the two access transistors have respective gates connected to the corresponding word lines, respective sources connected to the corresponding bit lines, and respective drains connected to respective outputs of the different inverters, each of the memory cells uses a potential of a High-data-holding power source for holding the High data as a first potential and uses a potential of a Low-data-holding power source for holding the Low data at any time other than a read operation period as a second potential, and a potential of the selected one of the plurality of word lines has a value obtained by adding a threshold voltage of each of the access transistors to the second potential.

Still another embodiment of the present invention is a semiconductor memory device including: a memory cell array having a plurality of memory cells arranged in a matrix of rows and columns; a plurality of word lines arranged to correspond to the respective rows of the memory cells; a plurality of bit lines arranged to correspond to the respective columns of the memory cells; a plurality of Low-data-holding-power-source control circuits arranged to correspond to the respective columns of the memory cells; a plurality of bit-line precharge circuits arranged to correspond to the respective columns of the memory cells; a plurality of write control circuits arranged to correspond to the respective columns of the memory cells; and a plurality of word line drivers arranged to correspond to the respective rows of the memory cells, wherein each of the memory cells has two access transistors and two inverters connected in a cross-coupled configuration to hold High data and Low data as a pair, wherein the two access transistors have respective gates connected to the corresponding word lines, respective sources connected to the corresponding bit lines, and respective drains connected to respective outputs of the different inverters, High-data-holding transistors of the two inverters have respective sources each connected to a High-data-holding power source for holding the High data, while Low-data-holding transistors of the two inverts have respective sources connected to a plurality of Low-data-holding power sources each for holding the Low data which are provided individually to correspond to the respective columns of the memory cells, each of the Low-data-holding power source control circuits has means for supplying a ground potential and a virtual ground potential higher than the ground potential to the Low-data-holding power source in the corresponding column of the memory cell array, each of the bit-line precharge circuits has means for supplying the virtual ground potential to the bit line in the corresponding column of the memory cell array, and each of the write control circuits has means for supplying the ground potential to the bit line in the corresponding column of the memory cell array, wherein when the memory cells are non-selected, each of the Low-data-holding-power-source control circuits supplies the virtual ground potential to the corresponding Low-data-holding power source, while each of the precharge circuits supplies the virtual ground potential to the corresponding bit line, during writing to one of the memory cells, the write control circuit corresponding to the selected column supplies the ground potential to the selected bit line, and during reading from one of the memory cells, the Low-data-holding-power-source control circuit corresponding to the selected column supplies the ground potential to the selected Low-data-holding power source.

BRIEF DESCRIPTION OF THE DRAWINGS

FIG. 4 is a table showing an example of potentials at the individual terminals of one of memory cells 11 when write and read operations are performed in the semiconductor memory device 100;

FIG. 6 is a table showing an example of potentials at the individual terminals of one of the memory cells 11 when write and read operations are performed in the semiconductor memory device 200;

FIG. 11 is a table showing an example of potentials at the individual terminals of one of the memory cells 11 when write and read operations are performed in the semiconductor memory device 300;

FIG. 14 is a table showing an example of potentials at the individual terminals of one of memory cells in a conventional semiconductor memory device.

DETAILED DESCRIPTION OF THE PREFERRED EMBODIMENTS

Figure 1:
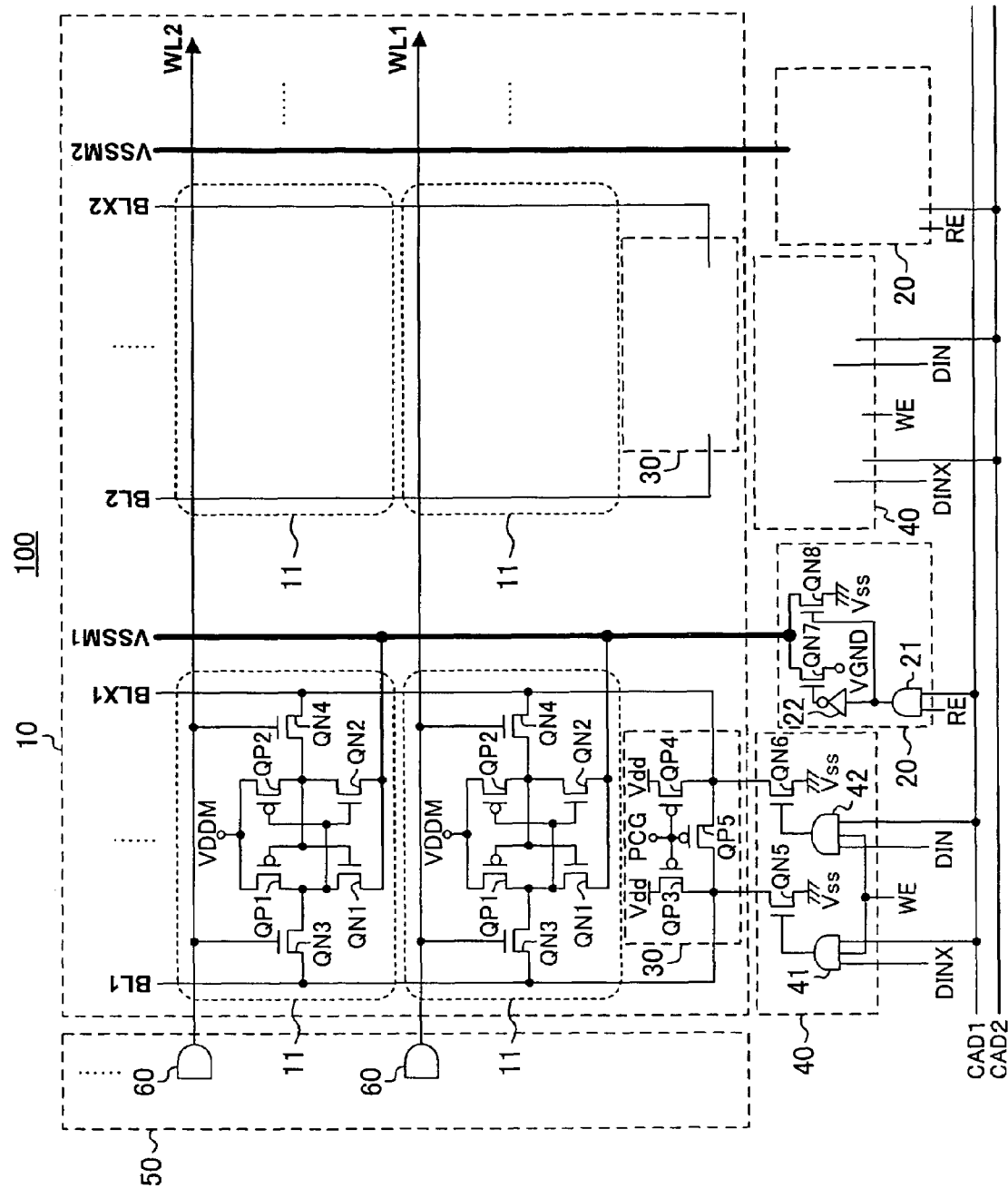
FIG. 1 is a block diagram showing a structure of a semiconductor memory device 100 according to a first embodiment of the present invention.

Referring to the drawings, the embodiments of the present invention will be described herein below. In the following description of the individual embodiments, a description of components having the same functions as the components that have been described once will be omitted by retaining the same reference numerals.

Embodiment 1

A semiconductor memory device 100 according to a first embodiment of the present invention will be described with reference to FIGS. 1 to 4.

(Structure of Semiconductor Memory Device 100)

FIG. 1 is a block diagram showing a structure of a semiconductor memory device 100. For easier illustration, an output-system circuit such as a sense amplifier is omitted in FIG. 1.

As shown in FIG. 1, the semiconductor memory device 100 comprises a plurality of Low-data-holding power source control circuits 20, a plurality of bit-line precharge circuits 30, a plurality of write control circuits 40, a memory cell array 10, and a row decoder 50.

In FIG. 1, WL1 and WL2 denote word lines each routed to extend in a row direction.

BL1, BL2, BLX1, and BLX2 denote bit lines each routed to extend in a column direction. The bit lines BL1 and BLX form a bit line pair, while the bit lines BL2 and BLX2 form a bit line pair.

PCG denotes a signal (precharge control signal PCG) transmitted via a signal line routed to extend in the row direction not shown. The precharge control signal PCG controls the bit-line precharge circuits 30. The precharge control signal PCG is on a Low level (hereinafter referred to as the L level) when each of the word lines is in an inactive state (when each of the word lines is on the L level in the present embodiment), while it is on a High level (hereinafter referred to as the H level) when either of the word lines is in an active state (when either of the word lines is on the H level in the present embodiment).

CAD1 and CAD2 denote column address signals.

DIN and DINX denote input data sets complementary to each other.

WE denotes a write enable signal. RE denotes a read enable signal.

VSSM1 and VSSM2 denote power source lines provided individually for respective columns. It is assumed herein that the VSSM1 and VSSM2 will be referred to as Low-data-holding power source lines.

The memory cell array 10 contains a plurality of memory cells 11. Specifically, the memory cells 11 are placed individually at the respective points of intersection between the word lines (WL1 and WL2) and the bit line pairs. The memory cells 11 thus arranged as a matrix compose the memory cell array 10 for storing information.

Each of the memory cells 11 specifically comprises load transistors QP1 and QP2 which are PMOS transistors, drive transistors QN1 and QN2 which are NMOS transistors, and access transistors QN3 and QN4 which are NMOS transistors. The threshold voltage of each of the transistors of the memory cells 11 is the same as that of each of logic transistors other than the transistors of the memory cells and has a value of, e.g., 0.3 V.

In the memory cell 11, the load transistor QP1 and the drive transistor QN1 constitute an inverter, while the load transistor QP2 and the drive transistor QN2 constitute an inverter. These inverters have respective input/output terminals connected to each other to compose a flip-flop. This allows the respective output terminals of the inverters to hold High data and Low data (data sets 0 and 1, though the High data and the Low data may be arbitrarily associated with any values). The respective output terminals of the inverters are referred to as data storage nodes. In particular, the data storage node storing therein the Low data (0 V) is termed a Low-data storage node.

The respective gate terminals of the access transistors QN3 and QN4 are connected to the same word line (the word line to which the memory cell corresponds, which is either WL1 or WL2 in the present embodiment). The source terminal of the access transistor QN3 is connected to one of the bits lines forming the bit line pair, while the source terminal of the access transistor QN4 is connected to the other bit line. The respective drain terminals of the access transistors QN3 and QN4 are connected individually to the respective input/output terminals of the different inverters. The respective source terminals of the drive transistors QN1 and QN2 constituting the inverter are each connected to the Low-data-holding power source line VSSM (VSSM1 or VSSM2) to which the memory cell 11 belongs.

On the other hand, the respective source terminals of the load transistors QP1 and QP2 are each connected to the High-data-holding power source VDDM. To the High-data-holding power source VDDM, power is supplied from the power source Vdd. The potential (Vdd) of the power source Vdd is, e.g., 1.1 V.

The Low-data-holding-power-source control circuits 20 are disposed individually in the respective columns of the memory cell array 10 to control the respective potentials of the Low-data-holding power source lines VSSM corresponding to the columns.

Specifically, each of the Low-data-holding-power-source control circuits 20 comprises NMOS transistors QN7 and QN8, an inverter 22, and an AND circuit 21.

To the Low-data-holding-power-source control circuit 20, either one of the column address signals (which is either one of CAD1 and CAD2) and the read enable signal RE are inputted. With these signals, the Low-data-holding-power-source control circuit 20 is controlled into a selected state or a non-selected state and controls the potential of the corresponding Low-data-holding power source line (VSSM1 or VSSM2) depending on whether it is in the selected state or the non-selected state.

When the Low-data-holding-power-source control circuit 20 is in the non-selected state, the NMOS transistor QN7 becomes conductive to supply a potential VGND as a potential between a potential Vss (ground potential) and the potential Vdd. The potential VGND is set to be higher than the potential Vss by a potential more than the threshold voltage of each of the access transistors QN3 and QN4. For example, the potential VGND is 0.5 V.

When the Low-data-holding-power-source control circuit 20 is in the selected state, the NMOS transistor QN8 becomes conductive to supply the potential Vss (ground potential of 0 V) to the corresponding Low-data-holding power source line VSSM.

The bit-line precharge circuits 30 are disposed individually in the respective columns of the memory cell array 10. Specifically, each of the bit-line precharge circuits 30 comprises precharge transistors QP3 and QP4 and an equalize transistor QP5. The bit-line precharge circuits 30 are placed individually at the respective points of intersection between the signals line for the precharge control signal PCG and the bit line pairs.

To the respective gate terminals of the transistors of each of the bit-line precharge circuit 30, the precharge control signal PCG is inputted. The respective source terminals of the precharge transistors QP3 and QP4 are each connected to the power source Vdd. The drain terminal of the precharge transistor QP3 is connected to the source terminal of the equalize transistor QP5, while the drain terminal of the precharge transistor QP4 is connected to the drain terminal of the NMOS transistor QN5. On the other hand, the drain terminal of the precharge transistor QP3 is connected to one of the bit lines forming the bit line pair, while the drain terminal of the precharge transistor QP4 is connected to the other bit line.

With the structure mentioned above, each of the bit-line precharge circuits 30 precharges each of the bit lines connected thereto to the potential Vdd (level Vdd) when the precharge control signal PCG is on the L level. When the precharge control signal PCG is on the H level, all the P-type MOS transistors (QP3 to QP5) composing the bit-line precharge circuits 30 are turned off so that a state (high impedance state) giving no influence to the bit lines is established.

The write control circuits 40 are disposed individually in the respective columns of the memory cell array 10. Each of the write control circuits 40 comprises AND circuits 41 and 42 and NMOS transistors QN5 and QN6.

To the AND circuit 41, either one of the column address signals CAD1 and CAD2, the input data DINX, and the write enable signal WE are inputted. To the AND circuit 42, the same column address signal, input data DINX, and write enable signal WE as inputted to the AND circuit 41 are inputted. As a result, the write control circuit 40 is brought into the selected state or the non-selected state. In the selected state, the write control circuit 40 drives either of the bit lines from the Vdd level to the potential Vss (ground potential) depending on the value of the input data DIN or DINX.

For example, when the column address signal CAD1 and the input data DINX are each in the selected state, the NMOS transistor QN5 disposed on the left end of FIG. 1 is selected so that the bit line BL1 is controlled from the level Vdd which is the precharge potential to the potential Vss (ground potential). The other non-selected bit line is held on the level Vdd.

The row decoder 50 contains a plurality of (specifically, as many as the word lines) word line drivers 60 for controlling the respective potentials of the word lines. The word line drivers 60 are connected individually in different combinations to a plurality of row address signal lines (not shown) so that one of the word line drivers 60 is selected by each access.

Each of the word line drivers 60 corresponds to either one of the word lines to drive the corresponding word line to a predetermined potential (described later) when it is selected.

Figure 2:
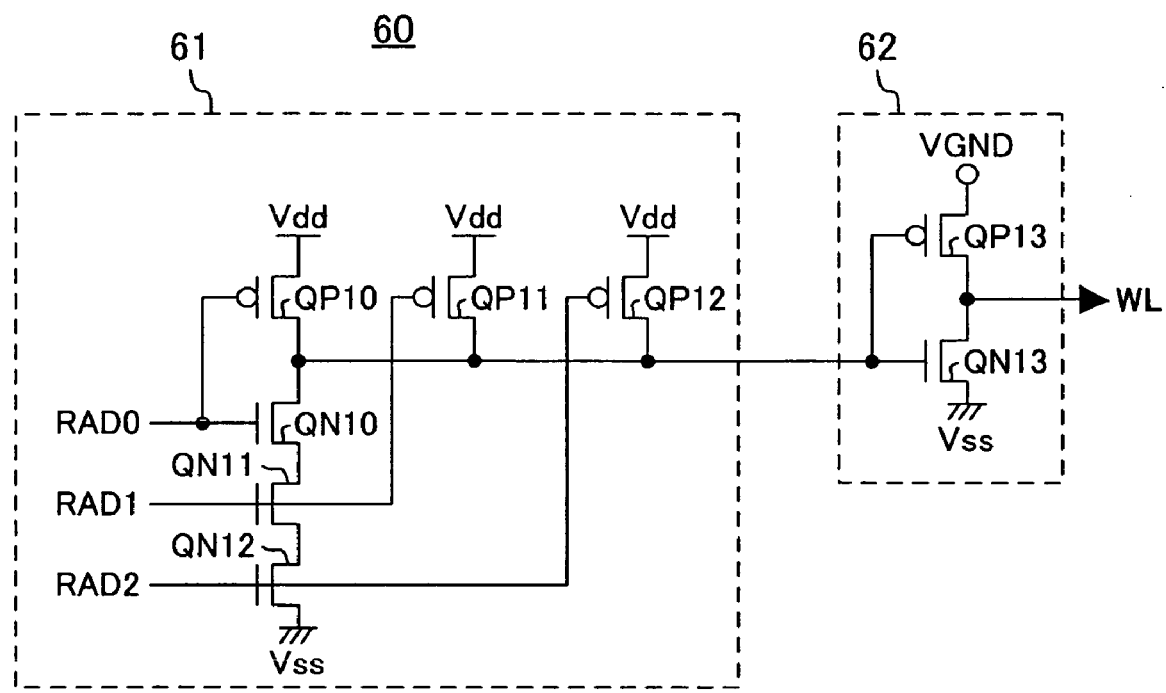
FIG. 2 is a view showing an example of a circuit structure of each of word line drivers 60.

FIG. 2 shows an example of a circuit structure of each of the word line drivers 60. In this example, the word line driver 60 comprises a NAND circuit 61 and a driver circuit 62.

The NAND circuit 61 comprises NMOS transistors QN10 to QN12 and PMOS transistors QP10 to QP12.

The respective source terminals of the NMOS transistors QN10 to QN12 are each connected to the potential Vss (ground potential), while the respective source terminals of the PMOS transistors QP10 to QP12 are each connected to the potential Vdd (1.1 V). To the gate terminal of each of the transistors of the NAND circuit 61, any of row address signals RAD0 to RAD2 is inputted. The respective source terminals of the PMOS transistors QP10 to QP12 are each connected to the input of the driver circuit 62.

The driver circuits 62 is composed of an NMOS transistors QN13 having a source terminal connected to the potential Vss (ground potential) and a PMOS transistor QP13 having a source terminal connected to the potential VGND (0.5 V). In the driver circuit 62, an output of the NAND circuit 61 is inputted to the gate terminal of the PMOS transistor QP13 and to the gate terminal of the NMOS transistor QN13, while the drain terminal of the NMOS transistor QN13 is connected to the corresponding word line.

When one of the word line drivers 60 is selected with the row address signals RAD0 to RAD2, the potential of an output signal from the driver circuit 62 becomes the potential VGND. When the word line driver 60 is non-selected, the potential of the output signal becomes the potential Vss (ground potential).

Figure 3:
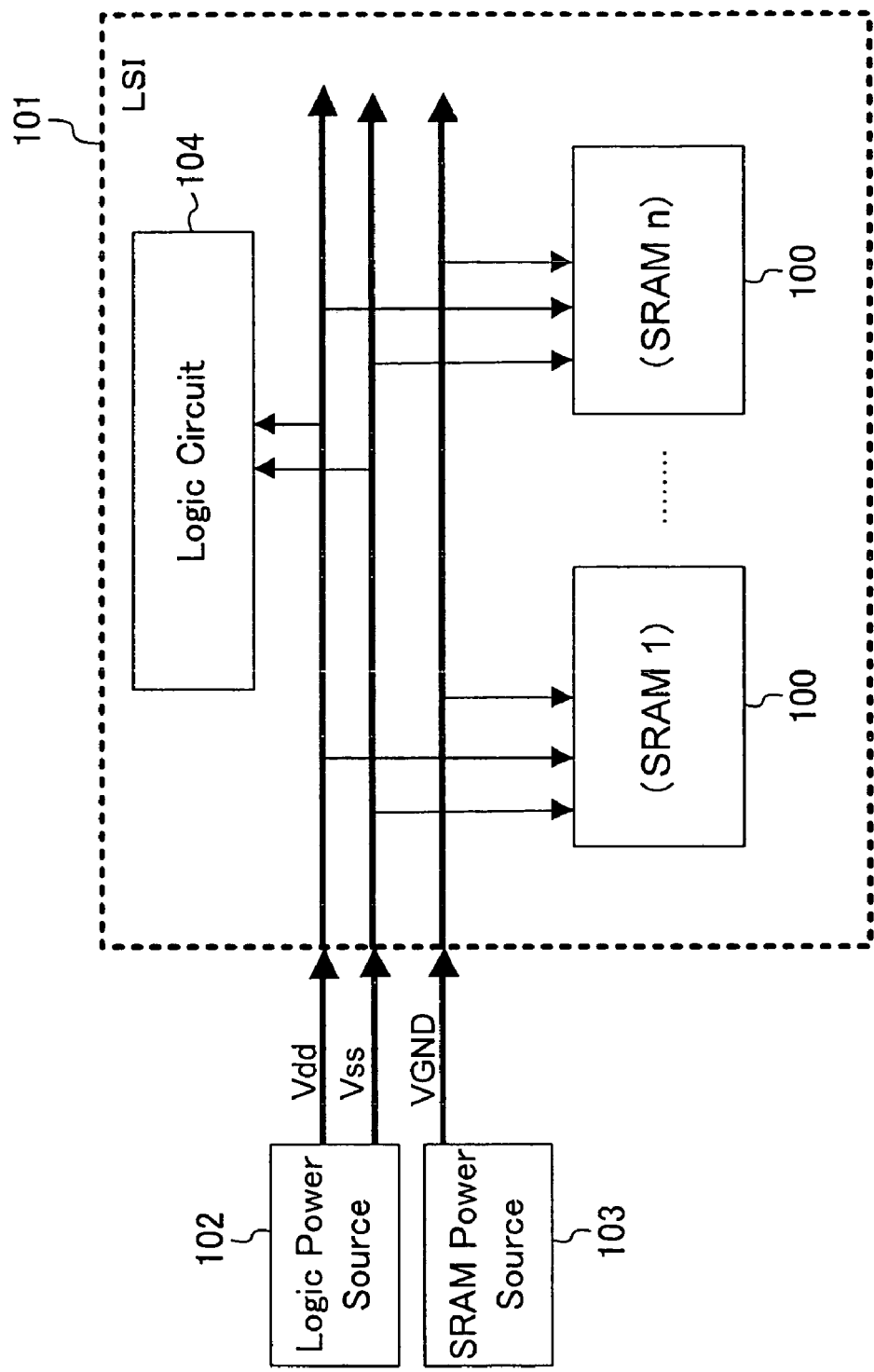
FIG. 3 is a block diagram showing an example of a system to which the semiconductor memory device 100 is applied.

FIG. 3 is a block diagram showing an example of a system to which the semiconductor memory device 100 is applied. The system comprises an LSI 101, a logic power source 102, and a SRAM power source 103.

The LSI 101 comprises a plurality of the semiconductor memory devices 100 (denoted by SRAM1 and SRAMn in the drawing) and a logic circuit 104.

The logic circuit 104 is a predetermined circuit for implementing, e.g., the function of the LSI 101, and has a plurality of transistors.

The logic power source 102 supplies the potential Vdd to each of the semiconductor memory devices 100 and the logic circuit 104.

The SRAM power source 103 supplies the potential of a Low-data-holding power source VGND to each of the semiconductor memory devices 100. The Low-data-holding power source VGND has the potential between the potential Vdd and the potential Vss.

(Operation of Semiconductor Memory Device 100)

1. Write Operation

A description will be given to the case where a write operation is performed in one of the semiconductor memory devices 100.

In a state where none of the memory cells is selected before the write operation is performed, the precharge control signal PCG is on the L level. When the precharge control signal PCG is on the L level, the bit-line precharge circuits 30 precharge the bit lines BL1, BL2, BLX1, and BLX2 to the Vdd level.

All the word lines have the potential Vss (ground potential) lower than the potential VGND which is the source potential of each of the drive transistors QN1 and QN2 of the memory cells 11. The access transistors QN3 and QN4 of the memory cells 11 are each in a non-conductive state.

The column address signals CAD1 and CAD2, the write enable signal WE, the read enable signal RE, and the input data sets DIN and DINX are each on the L level. All the Low-data-holding-power-source control circuits 20 supply the potential VGND to the corresponding Low-data-holding power source lines (VSSM1 and VSSM2).

When the write operation is initiated, the precharge control signal PCG shifts from the L level to the H level. This brings each of the bit-line precharge circuits 30 into the non-selected state and brings each of the precharge transistors QP3 to QP5 into the non-conductive state. As a result, the supply of the potential Vdd to each of the bit lines BL1, BL2, BLX1, and BLX2 is halted.

Then, the row decoder 50 brings the potential of either of the word lines WL1 and WL2 from the potential Vss (ground potential) to the potential VGND. As a result, in each of the memory cells 11 connected onto the word line having the shifted potential, the gate potential of each of the access transistors QN3 and QN4 becomes the potential VGND.

Then, either of the column address signals CAD1 and CAD2, the write enable signal WE, and either of the input data sets DIN and DINX shift from the L level to the H level. As a result, any of the plurality of write control circuits 40 is selected. In the selected write control circuit 40, the NMOS transistor QN5 or QN6 is activated to select the corresponding bit line (any of BL1, BL2, BLX1, and BLX2). As a result, the potential of the selected bit line is driven from the Vdd level to the potential Vss (ground potential).

As a result of the foregoing operation, in the selected memory cell 11, the gate potential of each of the access transistors QN3 and QN4 becomes the potential VGND (0.5 V), while the source potential of either of the access transistors QN3 and QN4 becomes the potential Vss (0 V) which is the bit line potential. Consequently, the gate-source potential difference (VGND−Vss) becomes 0.5 V (i.e., not less than the threshold voltage (0.3 V) of each of the access transistors QN3 and QN4) so that the access transistor QN3 or QN4 becomes conductive. This allows the inversion of the holding potential of the memory cell 11 so that writing is performed.

On the other hand, in each of the non-selected memory cells 11 connected to the selected word line, the gate potential of each of the access transistors QN3 and QN4 is the potential VGND (0.5 V), the source potential thereof is the potential Vdd (1.1 V) which is the bit line potential, and the drain potential thereof is the potential Vdd or the potential VGND which is the storage potential of each of the memory cells 11. Therefore, each of the access transistors QN3 and QN4 retains a cut-off state even though the word line is selected.

2. Read Operation

Next, a description will be given to the case where a read operation is performed in one of the semiconductor memory devices 100.

The state where none of the memory cells is selected before the read operation is performed is the same as the state where none of the memory cells is selected before the write operation is performed.

When the read operation is initiated, the write enable signal WE and the data input signal sets DIN and DINX are each held on the L level. In this case, the write control circuits 40 are each brought into the non-selected state so that the NMOS transistors QN5 and QN6 are each brought into the non-conductive sate. That is, the potential of the selected word line and the operation of each of the bit-line precharge circuits 30 are the same as during data writing.

At the same time, either of the column address signals CAD1 and CAD2 and the read enable signal RE shift from the L level to the H level so that any of the plurality of Low-data-holding-power-source control circuits 20 is selected. This brings the NMOS transistor QN7 of the selected Low-data-holding-power-source control circuit 20 into the non-conductive state and brings the NMOS transistor QN8 thereof into the conductive state. As a result, the potential of the Low-data-holding power source line (either of the Low-data-holding power source lines VSSM1 and VSSM2) corresponding to the selected Low-data-holding-power-source control circuit 20 shifts from the potential VGND to the potential Vss.

As a result of the foregoing operation, in the selected memory cell 11, the gate potential of each of the access transistors QN3 and QN4 becomes the potential VGND (0.5 V), while the source potential of either of the access transistors QN3 and QN4 becomes the potential Vss (0 V) which is a Low-data holding potential. Consequently, the gate-source potential difference (VGND−Vss) becomes 0.5 V (i.e., not less than the threshold voltage (0.3 V) of each of the access transistors QN3 and QN4) so that the access transistor QN3 or QN4 becomes conductive. This allows the potential held in the memory cell 11 to be read into the bit line (either of the bit lines BL1, BL2, BLX1, and BLX2).

On the other hand, in each of the non-selected memory cells 11 connected to the selected word line, the gate potential of each of the access transistors QN3 and QN4 is the potential VGND (0.5 V), the source potential thereof is the potential Vdd (1.1 V) which is the bit line potential, and the drain potential thereof is the potential Vdd or the potential VGND which is the storage potential of each of the memory cells 11. Therefore, each of the access transistors QN3 and QN4 holds a cut-off state even though the word line is selected.

FIG. 4 shows an example of potentials at the individual terminals of one of the memory cells 11 when write and read operations are performed in the semiconductor memory device 100. The potentials are summarized in the form of tables which individually show the respective potentials of the selected column, the selected word line (selected WL), the non-selected column, and the non-selected word line (non-selected WL) during a read operation and those during a write operation.

The potentials at the individual terminals shown in FIG. 4 have values when the potential Vdd, the potential Vss, and the potential VGND inputted to the semiconductor memory device 100 from the outside are 1.1 V, 0.0 V, and 0.5 V, respectively. It is assumed that the threshold voltage of each of the memory cell transistors (transistors composing the memory cells 11) is 0.3 V which is the same as the threshold voltage of each of logic transistors (transistors composing the circuits other than the memory cells 11 in the semiconductor memory device 100).

As can be seen from the drawing, the characteristic features of the semiconductor memory device 100 are as follows.

(1) During the write operation to any of the memory cells, the difference between the potential of the selected word line and the potential (VGND) of the Low-data-holding power source line VSSM is lower than the threshold voltage of each of the access transistors (QN3 and QN4) of the memory cell 11. In other words, the potential of the selected word line is lower than a potential obtained by adding up the potential of the Low-data-holding power source line VSSM and the threshold voltage of the access transistor. In this example, the value of the difference is 0 V (0.5 V−0.5 V) and lower than 0.3 V which is the threshold voltage of each of the access transistors (QN3 and QN4).

During the write and read operations, by cutting off the access transistors of the non-selected memory cells 11, the non-selected memory cells 11 are prevented from the degradation of the static noise margin resulting from the charge which flows from the bit line into the non-selected memory cells 11.

(2) During the write operation to the memory cell, by adjusting the potential of either of the bit lines forming the bit line pair in the selected column to a level (potential Vss (0 V) in this example) lower than the potential (VSSM=0.5 V in this example) of the Low-data-holding power source line VSSM, the potential inversion at the storage node in the memory cell 11 is facilitated.

In addition, it becomes possible to perform data writing to the selected memory cell without reducing the static noise margin of each of the non-selected memory cells, unlike in the conventional memory cell.

In addition, the contradictory relationship between the write margin and the static noise margin during writing is not observed, and the write margin can be adjusted only with an amount of decrease in the potential of the bit line BL.

Further, writing is performed without lowering the power source potentials of all the memory cells in the selected column during writing, unlike in the conventional memory cell. This does not affect the data holding by the non-selected memory cells on the selected column.

(3) During a read operation from any of the memory cells, reading is performed by shifting the potential of the Low-data-holding power source line on the selected column from 0.5 V to 0 V. This brings each of the access transistors (QN3 and QN4) of the selected memory cell into conduction and allows reading without reducing the static noise margin of each of the non-selected memory cells.

In addition, the cell current which determines the speed margin during reading can be adjusted with an amount of decrease in the potential of the Low-data-holding power source line VSSM.

(4) During the read operation from the memory cell, each of the non-selected word lines has a potential (which is 0 V in this example) lower than the potential (which is the potential VGND of 0.5 V in this example) of the Low-data-holding power source line VSSM. As a result, it is possible to reduce a leakage current flowing from the bit line (at a potential of 1.1 V) into the Low-data storage node (0 V).

(5) During the write and read operations, the potential of the selected word line is controlled to be the same as the potential (which is 0.5 V in this example) of the Low-data-holding power source line VSSM in each of the non-selected memory cells so that it is unnecessary to additionally perform a potential supply from the external power source or an internal power generation source to the word line, unlike in the conventional memory cell. That is, it becomes possible to reduce a circuit area and cost.

(6) Since the potential of each of the non-selected word lines, the potential of the bit line selected during the write operation, the potential of the Low-data-holding power source line VSSM of the column selected during the read operation are controlled to have the same value of 0 V, which is the potential of the external power supply source Vss, it is unnecessary to construct individual power supply source circuits. That is, it becomes possible to reduce the number of power source circuits, a wiring area, and cost.

(7) During the write operation, the potential of the High-data-holding power source VDDM of the memory cell 11 is not reduced, unlike that of the conventional memory cell. This allows enlargement of the margin of a memory-cell-data-holding power source.

(8) The enlargement of the static noise margin of each of the non-selected memory cells allows the threshold voltage of each of the memory cell transistors to be reduced to the same value as that of the threshold voltage of each of the logic transistors (e.g., a reduction from conventional 0.4 V to 0.3 V). This allows the omission of a threshold-voltage operating step exclusively for the memory cell, and also allows a reduction in process cost.

(9) By reducing the threshold of each of the memory cell transistors to the same value (0.3 V) as that of each of the logic transistors but not reducing the potential of the High-data-holding power source VDDM, it becomes possible to reduce the data-holding power source voltage of the memory cell 11 to a value lower than the voltage during writing (e.g., a reduction from 0.7 V which is the conventional voltage value during writing to 0.6 V). This allows the use of the power source Vdd (power source at, e.g., 1.1 V) to provide a potential between the potential of the High-data-holding power source VDDM and the potential Vss, though the bit line and the Low-data-holding power source line VSSM are each controlled to have a negative potential relative to the potential of the Low-data-holding power source line VSSM.

Thus, the present embodiment can achieve the effects stated in the foregoing (1) to (9) so that it is high in practical effectiveness.

Embodiment 2

Next, a semiconductor memory device 200 according to a second embodiment of the present invention will be described with reference to FIGS. 5 and 6.

Figure 5:
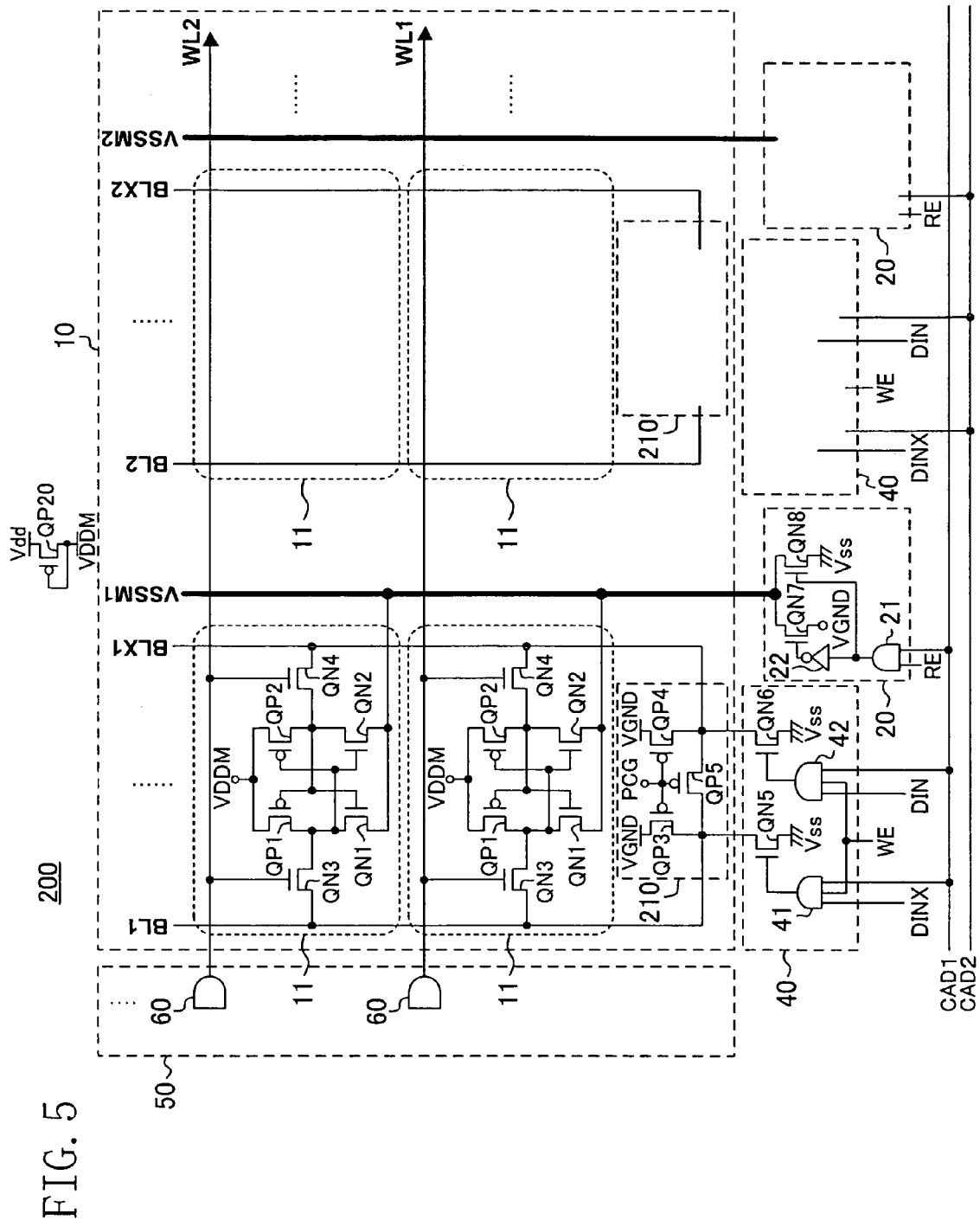
FIG. 5 is a block diagram showing a structure of a semiconductor memory device 200 according to a second embodiment of the present invention.

FIG. 5 is a block diagram showing a structure of the semiconductor memory device 200. For easier illustration, an output-system circuit such as a sense amplifier is also omitted in FIG. 5.

Specifically, the semiconductor memory device 200 has been obtained by replacing the bit-line precharge circuits 30 of the semiconductor memory device 100 with bit-line precharge circuits 210, adding a PMOS transistor QP20, and further changing the threshold voltage of each of the transistors of the memory cells 11.

The bit line precharge circuits 210 have been obtained by setting the source power source of each of the precharge transistors QP3 and QP4 in the bit-line precharge circuits 30 to the potential VGND (0.5 V). That is, the structure of each of the transistors of the bit-line precharge circuits 210 is the same as the structure of each of the transistors of the bit-line precharge circuits 30 in the semiconductor memory device 100. Since the cell current during a read operation is largely dependent on the difference between the word line potential (0.5 V) and the potential (0 V) of the Low-data-holding power source line VSSM, even when the bit-line precharge potential is reduced from 1.1 V to 0.5 V, a reduction in cell current is extremely small compared with the case where the bit line potential is the potential Vdd.

In the present embodiment, each of the transistors of the memory cells 11 is constructed to have a threshold voltage lower than that of each of the logic transistors other than the transistors of the memory cells 11. When the threshold voltage of the logic transistor is 0.3 V, the threshold voltage of each of the transistors of the memory cells 11 is set to, e.g., 0.2 V. As a result, a maximum voltage applied to each of the memory cell transistors becomes VDDM−Vss=0.8 V lower than the conventional maximum voltage Vdd−Vss=1.1 V so that the reliability of the insulating film of the memory cell transistor is improved. Accordingly, the gate insulating film of each of the transistors of the memory cells 11 is set to be thinner than the gate insulating film of each of the logic transistors other than the transistors of the memory cells.

The PMOS transistor QP20 is a transistor disposed on the periphery of the memory cell array 10 to generate the High-data-holding power source potential VDDM. The source of the PMOS transistor QP20 is connected to the power source Vdd, while the drain and gate thereof generate the High-data-holding power source potential VDDM of each of the memory cells 11. The potential of the High-data-holding power source VDDM has a value (0.8 V) lower than the potential Vdd (1.1 V) by the threshold voltage (0.3 V) of the PMOS transistor QP20.

By reducing the threshold voltage of each of the transistors of the memory cells 11 from 0.3 V to 0.2 V, the difference between the potential of the High-data-holding power source VDDM, which is the data holding potential for each of the memory cells 11, and the potential VSSM can be reduced to 0.3 V obtained by giving a margin of 0.1 V to the threshold voltage of each of the memory cell transistors.

A write operation and a read operation in the semiconductor memory device 200 are the same as those in the semiconductor memory device 100 according to the first embodiment except that the power source potential is different.

FIG. 6 shows potentials at the individual terminals of one of the memory cells 11 when write and read operations are performed in the semiconductor memory device 200. The potentials at the individual terminals shown in FIG. 6 have values when the potential Vdd, the potential Vss, and the potential VGND each inputted to the semiconductor memory device 200 from the outside are 1.0 V, 0.0 V, and 0.5 V, respectively.

As can be seen from the drawing, the characteristic features of the semiconductor memory device 200 are as follows.

(10) By reducing the threshold voltage of each of the transistors of the memory cells 11 (from 0.3 V to 0.2 V), the data hold margin, cell current, and write margin of each of the memory cells 11 are increased.

In addition, because the concentration of an impurity for threshold adjustment decreases, variations in the threshold voltages of the memory cell transistors are reduced and the operation margins of each of the memory cells are enlarged.

Moreover, since the potential difference (which is 0.3 V in this example) between the High-data-holding power source VDDM and the Low-data-holding power source VSSM, each as the data holding power source of each of the memory cells, can be reduced, the data hold margin of the memory cell can be increased.

(11) Since the potential (0.8 V) of the High-data-holding power source VDDM of each of the memory cells 11 is controlled to be lower than the potential (1.1 V) of the external power source Vdd and the maximum voltage applied to the memory cell 11 is controlled to be lower than that applied conventionally, the reliability of each of the memory cell transistors is improved. In the example shown above, the conventional maximum voltage of Vdd–Vss=1.1 V is reduced to VDDM–Vss=0.8 V.

Because the potential of each of the bit lines is adjusted to be lower than the conventional bit line potential, lower power consumption can be achieved. In the example shown above, the potential of the bit line is reduced from 1.1 V to 0.8 V.

(12) Since the thickness of the gate insulating film of each of the memory cell transistors can be reduced to be smaller than that of the gate insulating film of each of the logic transistors and the conventional memory cell transistors, it is possible to reduce variations in the threshold voltages of the transistors normally dependent on the film thickness. Therefore, it becomes possible to enlarge the operation margins of each of the memory cells 11.

(13) Since the High-data-holding power source potential VDDM is generated using the threshold voltage of the PMOS transistor QP20 disposed on the periphery of the memory cells 11, a high-data-holding power source VDDM can be formed with a simple and easy circuit structure. As a result, it becomes possible to reduce the circuit area to a size smaller than in the case of supplying power from a dedicated power source.

(14) Since the bit-line precharge potential is lowered from the potential Vdd to the potential VGND, the bit line potential during the write operation lowers to achieve lower power consumption.

Thus, the present embodiment can achieve the effects stated in the foregoing (11) to (14) so that it is high in practical effectiveness.

Embodiment 3

Next, a semiconductor memory device 300 according to a third embodiment of the present invention will be described with reference to FIGS. 7 to 11.

(Structure of Semiconductor Memory Device 300)

Figure 7:
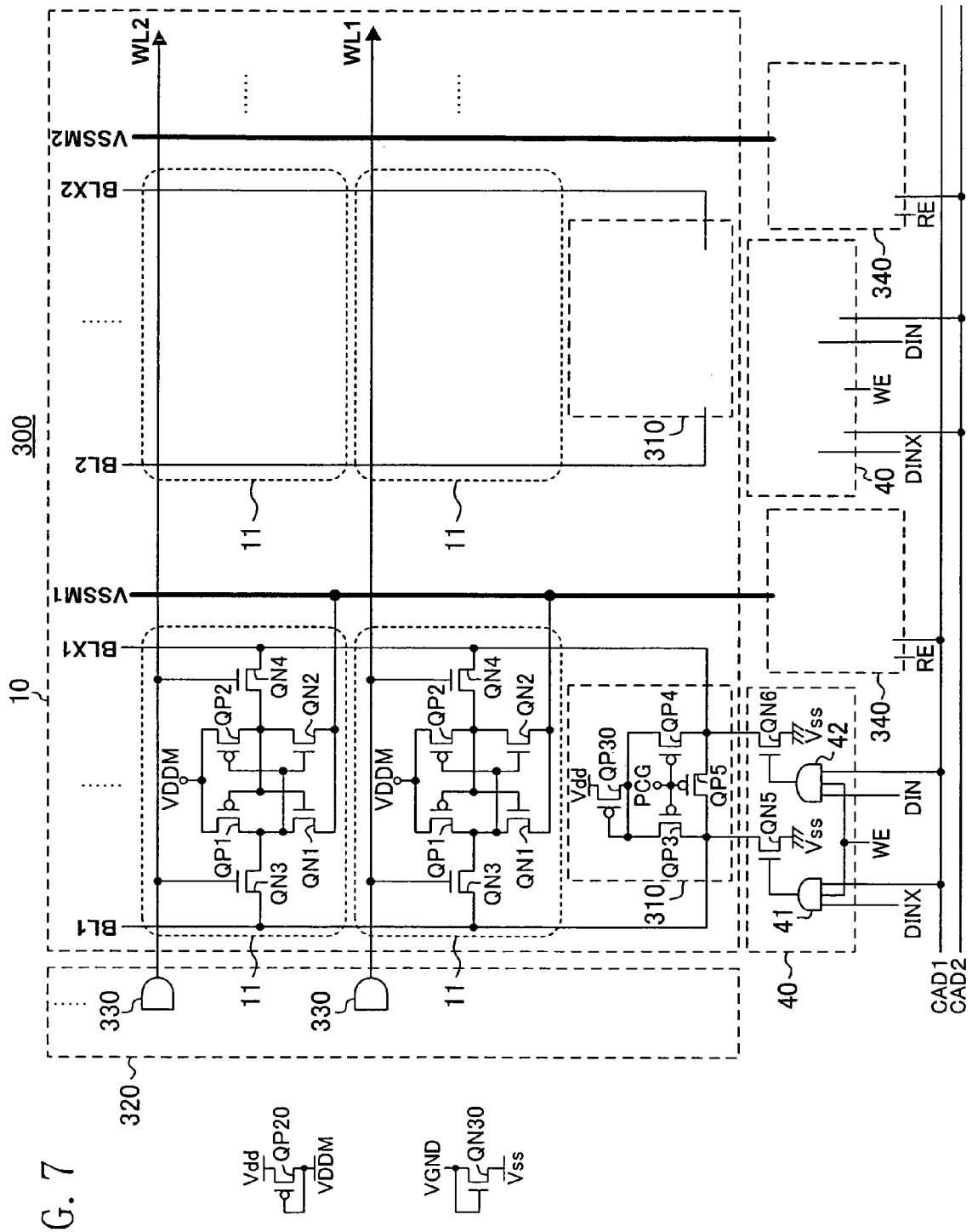
FIG. 7 is a block diagram showing a structure of a semiconductor memory device 300 according to a third embodiment of the present invention.

FIG. 7 is a block diagram showing a structure of the semiconductor memory device 300 according to the third embodiment. For easier illustration, an output-system circuit such as a sense amplifier is also omitted in FIG. 7.

The semiconductor memory device 300 has been constructed by replacing the bit-line precharge circuits 210 of the semiconductor memory device 200 with bit-line precharge circuits 310, replacing the row decoder 50 with a row decoder 320, replacing the Low-data-holding-power-source control circuits 20 with Low-data-holding-power-source control circuits 340, and adding an NMOS transistor QN30.

The NMOS transistor QN30 is a transistor disposed on the periphery of the memory cell array 10 to generate the potential VGND. The source of the NMOS transistor QN30 is connected to the ground power source Vss, while the drain and gate thereof generate the potential VGND. The potential VGND is higher than the ground power source potential Vss (0 V) by the threshold voltage (0.3 V) of the NMOS transistor QN3.

Each of the bit-line precharge circuits 310 is obtained by adding the PMOS transistor QP30 to each of the bit-line precharge circuits 210. The source of the PMOS transistor QP30 is connected to the power source Vdd, while the gate and drain thereof are connected to the respective sources of the precharge transistor QP3 and the precharge transistor QP4.

The row decoder 320 is constructed by replacing the word line drivers 60 of the row decoder 50 with word line drivers 330.

Figure 8:
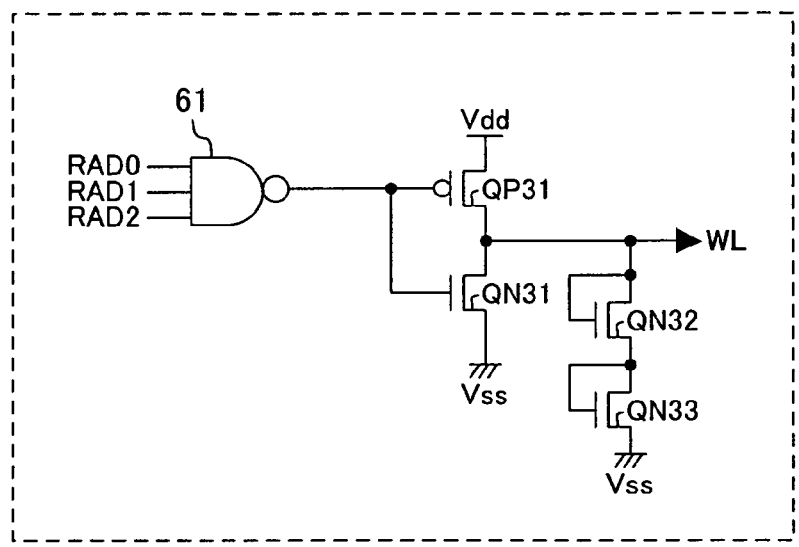
FIG. 8 is a view showing an example of a circuit structure of each of word line drivers 330.

Each of the word line drivers 330 corresponds to either one of the word lines and drives the corresponding word line to a predetermined potential when it is selected. FIG. 8 shows an example of a circuit structure of the word line driver 330.

Each of the word line drivers 330 comprises the NAND circuit 61 shown in FIG. 2, a PMOS transistor QP31, and NMOS transistors QN31 to QN33.

An output of the NAND circuit 61 is connected to the gate of each of the PMOS transistor QP31 and the NMOS transistor QP31. The source of the PMOS transistor QP31 is connected to the potential Vdd, while the source of the NMOS transistor QN31 is connected to the potential Vss (ground potential). The drain of the PMOS transistor QP31 and the drain of the NMOS transistor QN31 drive the corresponding word line.

The gate and source of the NMOS transistor QN32 are each connected to the corresponding word line. The gate and source of the NMOS transistor QN33 are each connected to the drain of the NMOS transistor QN32, while the drain thereof is connected to the potential Vss (ground potential).

The threshold voltage of the NMOS transistor is the same as the threshold voltage of each of the memory cell transistors. The threshold voltage of the NMOS transistor QN33 is the same as the threshold voltage of each of the logic transistors.

Figure 9:
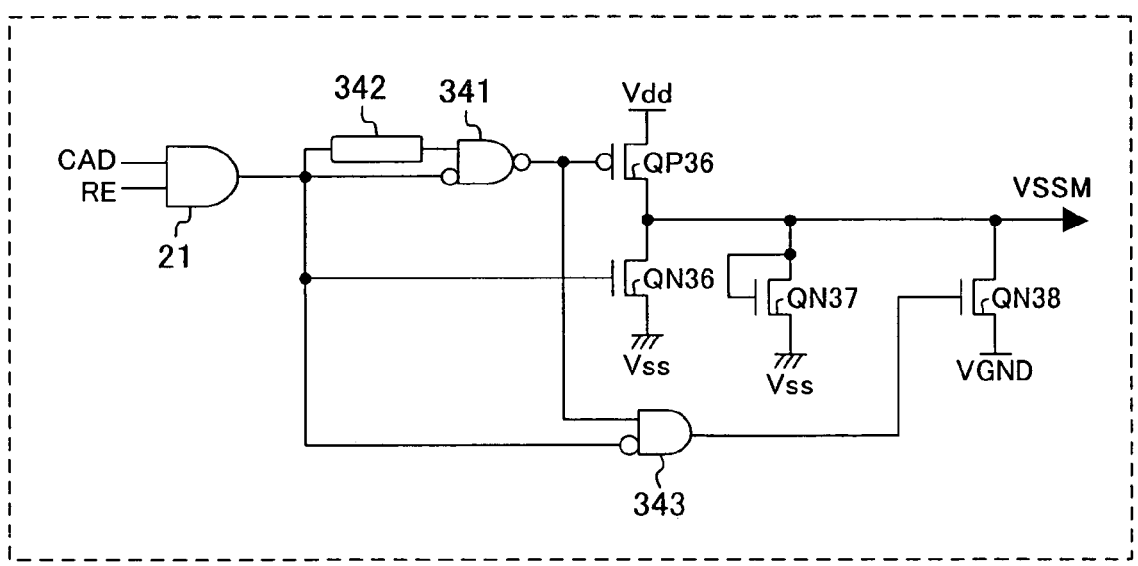
FIG. 9 is a view showing an example of a circuit structure of each of Low-data-holding-power-source control circuits 340.

The Low-data-holding-power source control circuits 340 are disposed individually in the respective columns of the memory cell array 10 to control the potentials of the Low-data-holding power source lines VSSM corresponding to the columns. FIG. 9 shows an example of a circuit structure of each of the Low-data-holding-power-source control circuits 340.

In this example, each of the Low-data-holding-power-source control circuits 340 comprises the AND circuit 21, a PMOS transistor QP36, NMOS transistors QN36 to QN38, a NAND circuit 341, a delay element 342, and an AND circuit 343.

In each of the Low-data-holding-power-source control circuits 340, the AND circuit 21 has an output connected to each of the NMOS transistor QN36, the NAND circuit 341, the delay element 342, and the AND circuit 343. The NAND circuit 341 has an output connected to the gate of the PMOS transistor QP36 and to the AND circuit 343. The NAND circuit 341 and the delay element 342 constitute a pulse generation circuit which generates a Low pulse dependent on a signal propagation delay in the delay element 342 when an output of the AND circuit 21 rises. The NMOS transistor QN37 has a drain and a gate each connected to the Low-data-holding power source line VSSM, while having a source connected to the potential Vss (ground potential). The AND circuit 343 has an output connected to the gate of the NMOS transistor QN38. The NMOS transistor QN38 has a source connected to the Low-data-holding power source VGND, while having a drain connected to the Low-data-holding power source line VSSM.

Figure 10:
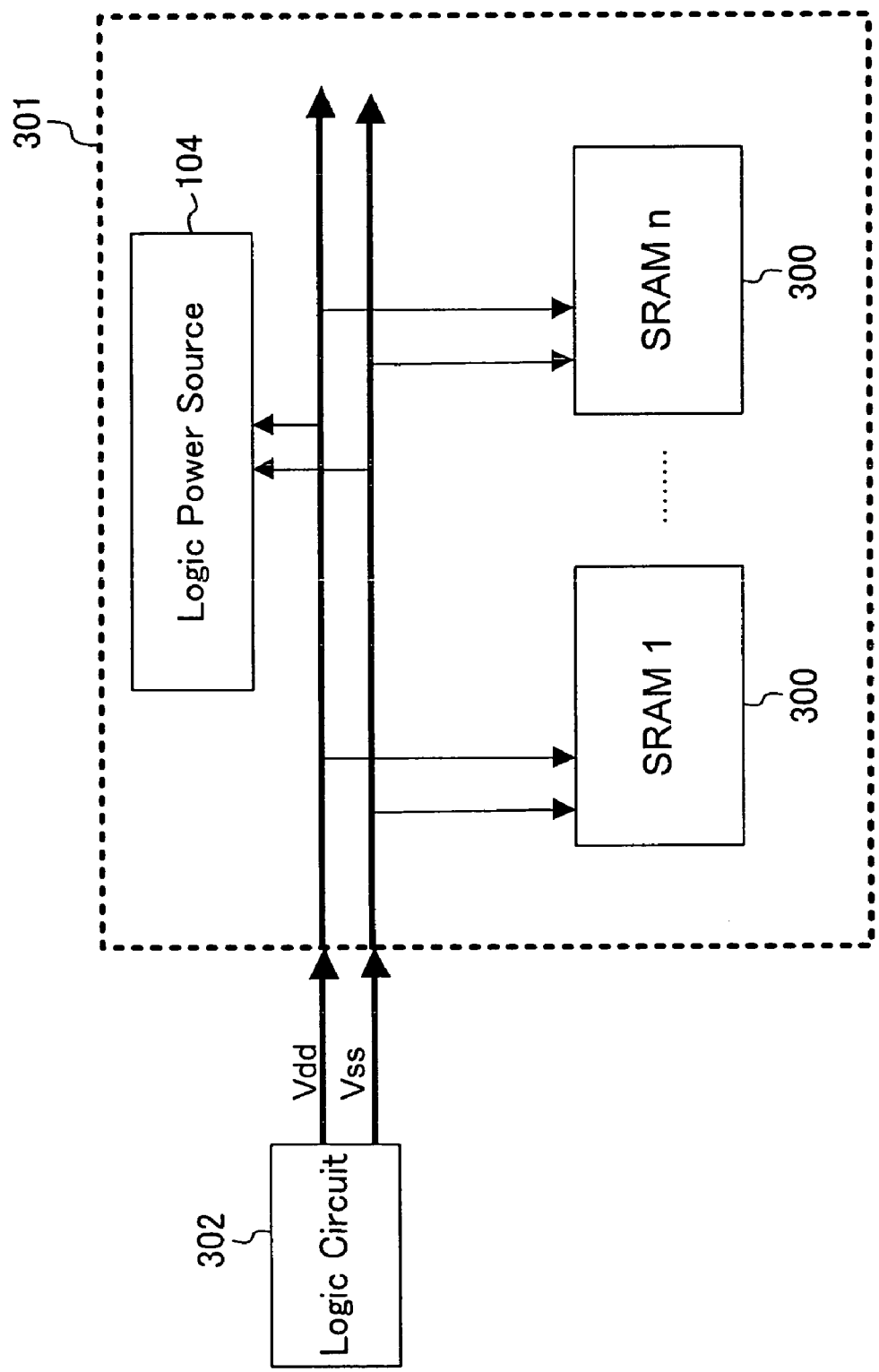
FIG. 10 is a block diagram showing an example of a system to which the semiconductor memory device 300 is applied.
Figure 12:
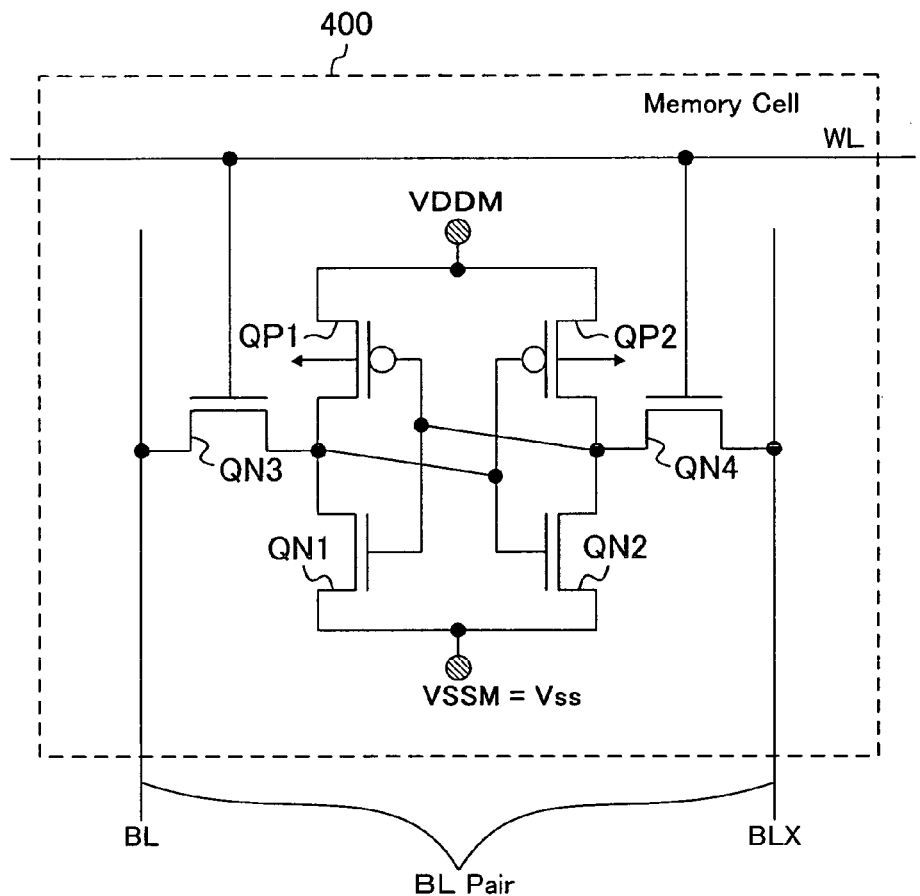
FIG. 12 is a view showing a typical flip-flop SRAM memory cell composed of CMOS transistors.
Figure 13:
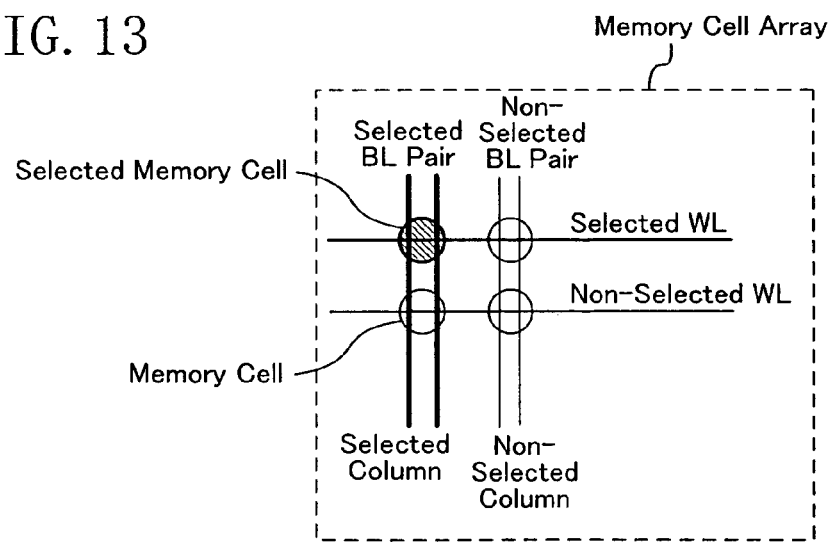
FIG. 13 is a schematic view of a memory cell array in which memory cells 400 as flip-clop SRAM memory cells are arranged on an array.

FIG. 10 is a block diagram showing an example of a system to which the semiconductor memory device 300 is applied. The system comprises an LSI 301 and a logic power source 302.

The LSI 301 comprises a plurality of the semiconductor memory devices 300 (denoted by SRAM1 and SRAMn in the drawing) and the logic circuit 104.

The logic power source 302 supplies the potential Vdd to each of the semiconductor memory devices 300 and the logic circuit 104. The potential Vdd in the present embodiment is, e.g., 0.9 V.

(Operation of Semiconductor Memory Device 300)

1. Write Operation

A description will be given to the case where a write operation is performed in one of the semiconductor memory devices 300.

In a state where none of the memory cells is selected before the write operation is performed, the precharge control signal PCG is on the L level. At this time, the precharge transistors QP3 and QP4 become conductive to precharge each of the bit lines BL1, BL2, BLX1, and BLX2 via the PMOS transistor QP30 to a potential (e.g., 0.6 V) lower than the potential Vdd (0.9 V) by the threshold voltage of the PMOS transistor QP30. This potential is the same as the potential of the High-data-holding power source VDDM generated by the PMOS transistor QP20.

In this manner, the bit-line precharge circuit 310 precharges each of the bit lines BL1, BL2, BLX1, and BLX2 to the same potential as the potential VDDM.

Since the NAND circuit 61 of each of the word line drivers 330 is in the non-selected state, the gate input potential of the NMOS transistor QN31 is on the H level so that the word line is on the potential Vss (ground potential) lower than the potential of the Low-data-holding power source VGND. Accordingly, each of the access transistors QN3 and QN4 of the memory cells 11 is in the non-conductive state.

Since the column address signals CAD1 and CAD2, the write enable signal WE, the read enable signal RE, and the input data sets DIN and DINX are each on the L level, the AND circuit 21 of each of the Low-data-holding-power-source control circuits 340 is in the non-selected state. As a result, the potential VGND is supplied to each of the Low-data-holding power source lines VSSM.

When the write operation is initiated, the precharge control signal PCG shifts from the L level to the H level. This brings each of the bit-line precharge circuits 310 into the non-selected state and brings each of the precharge transistors QP3 to QP5 into the non-conductive state. As a result, the supply of the same potential as the potential VDDM to each of the bit lines BL1, BL2, BLX1, and BLX2 is halted.

Then, when any of the plurality of word line drivers 330 is selected with the address signals RAD0 to RAD2, the NMOS transistor QN31 of the selected word line driver 330 becomes non-conductive, while the PMOS transistor QP31 becomes conductive. As a result, charge is supplied from the power source Vdd to the selected word line.

At this time, when the potential of the word line becomes higher than the sum of the threshold voltage of the NMOS transistor QN32 and the threshold of the NMOS transistor QN33, both of the NMOS transistors QN32 and QN33 become conductive so that the potential of the word line is suppressed to the same potential as the sum of the two threshold voltages. The potential of the word line is on the same order as a value obtained by adding up the potential VGND (0.3 V, i.e., the potential of the Low-data-holding power source line VSSM) and the threshold voltage (0.2 V) of each of the access transistors QN3 and QN4 of the memory cells 11.

That is, the potential of the word line becomes a boundary potential at which each of the access transistors of the memory cells 11 changes from the cut-off state to the conductive state. Accordingly, a current flowing in each of the access transistors QN3 and QN4 is extremely smaller than the case where the potential of the word line is the potential Vdd.

Next, either of the column address signals CAD1 and CAD2, the write enable signal WE, and either of the input data sets DIN and DINX shift from the L level to the H level. As a result, any of the plurality of write control circuits 40 is selected, and either of the NMOS transistors QN5 and QN6 in the selected write control circuit 40 is selected. As a result, any of the bit lines BL1, BL2, BLX1, and BLX2 is selected, and the selected bit line is driven from the same potential as the VDDM potential, which is the potential during precharging, to the potential Vss (ground potential).

As a result of the foregoing operation, the gate potential of each of the access transistors QN3 and QN4 of the selected memory cell 11 has a value of 0.5 V obtained by adding the threshold voltage (0.2 V) of each of the access transistors QN3 and QN4 to the potential VGND (0.3 V) which is the Low-data-holding power source potential. At the same time, the drain potential of either of the access transistors of the selected memory cell 11 becomes Vss (0 V), which is the bit line potential, so that the gate-drain potential difference of the access transistor is 0.5 V and exceeding the threshold voltage. This brings the access transistor QN3 or QN4 of the selected memory cell into the conductive state. Therefore, it becomes possible to invert the holding potential of the memory cell 11 and perform writing.

On the other hand, in each of the non-selected memory cells 11 located under the selected word line, the gate potential of each of the access transistors QN3 an QN4 is 0.5 V, the source potential thereof is 0.6 V which is the bit-line precharge potential, and the drain potential thereof is the potential VDDM (0.6 V) or the potential VSSM (0.3 V) which is the storage potential of each of the memory cells 11. Accordingly, each of the access transistors QN3 and QN4 of the non-selected memory cells 11 has the boundary potential at which the access transistor changes from the cut-off state to the conductive state. In other words, the current flowing from the bit line into the storage node is extremely small so that the non-selected memory cells 11 are immune to the influence of noise from the bit line.

2. Read Operation

Next, a description will be given to the case where a read operation is performed in one of the semiconductor memory devices 300.

The state where none of the memory cells is selected before the read operation is performed is the same as the state where none of the memory cells is selected before the write operation is performed.

When the read operation is initiated, the write enable signal WE and the data input signal sets DIN and DINX are each held on the L level. As a result, the write control circuits 40 are each brought into the non-selected state so that the NMOS transistors QN5 and QN6 are each brought into the non-conductive sate. The potential of the selected word line (either WL1 or WL2) and the operation of each of the bit-line precharge circuits 310 are the same as during data writing.

On the other hand, either of the column address signals CAD1 and CAD2 and the read enable signal RE shift from the L level to the H level so that any of the plurality of Low-data-holding-power-source control circuits 340 is selected.

Then, the NMOS transistor QN36 in the Low-data-holding-power-source control circuit 340 becomes conductive and the VSSM line selected between the Low-data-holding power source lines VSSM1 and VSSM2 charged in advance to the potential VGND (0.3 V) shifts to the ground power source potential Vss (0 V).

As a result of the foregoing operation, the gate potential of each of the access transistors QN3 and QN4 of the selected memory cell 11 has a value of 0.5 V obtained by adding the threshold voltage (0.2 V) of each of the access transistors QN3 and QN4 to the potential VGND (0.3 V) which is the Low-data-holding power source potential. On the other hand, the source potential of either of the access transistors QN3 and QN4 becomes the potential Vss (0 V) which is the Low-data-holding potential. Consequently, the gate-source potential difference has a value (0.5 V) of not less than the threshold of each of the access transistors QN3 and QN4 so that the access transistor QN3 or QN4 of the selected memory cell 11 becomes conductive. This allows the holding potential of the memory cell 11 to be read into any of the bit lines BL1, BL2, BLX1, and BLX2.

On the other hand, in each of the non-selected memory cells 11 under the selected word line, the gate potential of each of the access transistors QN3 and QN4 is 0.5 V, the source potential thereof is 0.6 V which is the bit-line precharge potential, and the drain potential thereof is the potential VDDM (0.6 V) or the potential VGND (0.3 V) which is the storage potential of each of the memory cells 11. Accordingly, each of the access transistors QN3 and QN4 of the non-selected memory cells 11 has the boundary potential at which the access transistor changes from the cut-off state to the conductive state. In other words, the current flowing from the bit line into the storage node is extremely small so that the non-selected memory cells 11 are immune to the influence of the bit line.

After the read operation, each of the read enable signal RE and the column address signals CAD1 and CAD2 becomes non-selected so that the potential of the Low-data-holding power source line VSSM shifts to the L level. As a result, the AND circuit 21 of the Low-data-holding-power-source control circuit 340 becomes non-selected and the output thereof shifts to the L level. Accordingly, the NMOS transistor QN36 becomes non-conductive and the NAND circuit 341 generates a Low pulse having a given period to charge the Low-data-holding power source line VSSM from the power source Vdd via the PMOS transistor QP36.

At this time, when the potential of the Low-data-holding power source line VSSM increases to reach the threshold voltage of the NMOS transistor QN37, the NMOS transistor QN37 becomes conductive so that the potential of the Low-data-holding power source line VSSM is set at the same level as the potential VGND. Then, when the generation of the pulse from the NAND circuit 341 is completed and the output thereof shifts from the L level to the H level, the output of the AND circuit 343 shifts from the L level to the H level so that the NMOS transistor QN38 becomes conductive. As a result, the potential of the Low-data-holding power source line VSSM is finally equalized to and have the same value as the potential VGND.

FIG. 11 shows an example of potentials at the individual terminals of one of the memory cell when write and read operations are performed in the semiconductor memory device 300. The potentials at the individual terminals are shown by way of example when the potential Vdd and the potential Vss each inputted from the outside to the semiconductor memory device 300 are 0.9 V and 0.0 V, respectively, and the potential VDDM and the potential VSSM (VGND) each generated in the inside thereof are 0.6 V and 0.3 V, respectively.

As can be seen from the foregoing, the characteristic features of the semiconductor memory device 300 are as follows.

(15) Since the potential of the word line is controlled to have a value (which is 0.5 V in the example shown above) close to the boundary potential at which the access transistor of the memory cells changes from the cut-off state to the conductive state, the access transistor of each of the non-selected memory cells 11 has a sufficiently low current supplying ability compared with the case where the potential of the word line is close to the potential Vdd as has been in the conventional memory cell. Accordingly, even under the selected word line, the charge flowing from the bit line into the non-selected memory cell 11 is extremely small, and it is therefore possible to prevent the degradation of the static noise margin of the non-selected memory cell 11.

(16) By generating the Low-data-holding power source potential VGND for each of the memory cells within the semiconductor memory device 300, it is no more necessary to supply the Low-data-holding power source potential VGND exclusively for the SRAM from outside the LSI. This allows reductions in power source cost and power source line area.

(17) Since the Low-data-holding power source potential VGND is generated using the threshold voltage of the NMOS transistor QN30, it becomes possible to construct a circuit for generating the Low-data-holding power source potential VGND having a simple structure and occupying a small area.

(18) Since the bit-line precharge potential is controlled to be the VDDM potential (0.6 V), a cell current value higher than in the semiconductor memory device 200 can be obtained when the voltage of the Low-data-holding power source VGND is reduced to a lower value (e.g., 0.3 V). In addition, a smaller charge amplitude and lower power consumption can be achieved than in the case where each of the bit lines is precharged to the potential Vdd (0.9 V) as has been precharged in the conventional semiconductor memory device.

(19) During the write operation to the memory cell 11, the potential of either of the bit lines (BL) forming a bit line pair in the selected column is lowered to the potential Vss (0 V) lower than the Low-data-holding power source potential VGND (0.3 V) of the memory cell 11, while the potential of the word line is increased to a level (0.5 V) in the vicinity of the threshold voltage of the access transistor, as stated in the foregoing (15). Accordingly, compared with the case where the word line potential is the potential VGND as is in the semiconductor memory device 100 or 200, the difference between the Low-data-holding power source potential VGND (VSSM potential) and the ground potential (Vss) can be reduced. As a result, it is possible to reduce the difference between the potential Vdd and the potential Vss from the conventional value to a smaller value (from 1.1 V to 0.6 V in the example shown above), while keeping the write margin. That is, the power source voltage can be lowered and lower power consumption can be achieved.

(20) During the read operation from the memory cell 11, reading is performed by shifting the potential of the Low-data-holding power source line VSSM from 0.3 V to 0 V, while increasing the potential of the word line to a value (0.5 V) in the vicinity of the threshold voltage of the access transistor, as stated in the foregoing (15). As a result, reading can be performed without degrading the cell current of the selected memory cell. In addition, because the charge/discharge amplitude of the Low-data-holding power source line VSSM can be reduced, lower power consumption can be achieved.

(21) Since the maximum power source voltage (VDDM−Vss=0.6 V) applied to the memory cell 11 is reduced, the insulating film of the memory cell transistor can further be thinned. As a result, it becomes possible to further reduce Vt variations in the memory cell transistors and increase the operation margins of the memory cell 11.

(22) Since the bit-line precharge circuit 310 is constructed to generate, from the external power source Vdd, the same potential as the High-data-holding power source potential VDDM, there is no noise given to the High-data-holding power source VDDM during the precharging of the bit lines. Accordingly, the potential of the High-data-holding power source VDDM of the memory cell array is more stable than in the case where the precharge potential is supplied directly from the High-data-holding power source VDDM of the memory cell to the bit line. In other words, it becomes possible to prevent data destruction resulting from noise.

(23) Since the word line driver 330 is constructed to generate the word line potential (0.5 V) from the external power source Vdd, there is less noise given to the High-data-holding power source VDDM during the charging of the word line and the potential of the High-data-holding power source VDDM of the memory cell array is more stable than in the case where charge is supplied from the High-data-holding power source VDDM of the memory cell to the word line. In other words, it becomes possible to prevent data destruction resulting from noise.

(24) Since the word line potential during the charging of the word line is set to the conduction threshold (0.5 V) of the access transistor using the threshold voltages of the NMOS transistor QN33 and the NMOS transistor QN32, the word line potential can be obtained with a simple and easy structure. That is, compared with the case where a dedicated power source circuit is constructed, the area occupied by the word line drivers can be reduced.

(25) After the read operation, when the Low-data-holding power source line VSSM is charged from the potential Vss (0 V) to the potential (0.3 V) of the Low-data-holding power source VGND, charging is performed by supplying charge from the power source Vdd (0.9 V) to the Low-data-holding power source line VSSM. As a result, there is no noise given to the Low-data-holding power source VGND so that, compared with the case where charge is supplied from the Low-data-holding power source VGND, the Low-data-holding power source of the memory array is stabilized. In other words, it becomes possible to prevent data destruction resulting from noise.

(26) Since the same potential (0.3 V) as the potential VGND which is the potential of the Low-data-holding power source line VSSM during charging is generated using the threshold voltage of the logic transistor, the same potential as the potential VGND can be supplied to the Low-data-holding power source line VSSM with a simple and easy structure. As a result, it becomes possible to reduce the area occupied by the Low-data-holding-power-source control circuits.

(27) Since the Low-data-holding power source line VSSM is charged from the power source Vdd to be equalized to and have the same potential as the potential VGND, it becomes possible to eliminate potential variations during the charging of the Low-data-holding power source line VSSM.

Thus, the present embodiment can achieve the effects stated in the foregoing (15) to (27) so that it is high in practical effectiveness.

Thus, the semiconductor memory device according to the present invention has the effect of enlarging the read margin, the write margin, the speed margin, and the data hold margin which are contradictory to each other, and is therefore useful as a semiconductor memory device comprising flip-flip memory cells or the like.

The invention claimed is:

1. A semiconductor memory device comprising:
    a memory cell array having a plurality of memory cells arranged in a matrix of rows and columns;
    a plurality of word lines arranged to correspond to the respective rows of the memory cells; and
    a plurality of bit lines arranged to correspond to the respective columns of the memory cells, wherein
    each of the memory cells has two access transistors and two inverters connected in a cross-coupled configuration to hold High data and Low data as a pair, wherein
    the two access transistors have respective gates connected to the corresponding word lines, respective sources, and respective drains, one of the source and the drain in each of the two access transistors being connected to the bit line and the other being connected to one of outputs of the inverter,
    each of the memory cells uses a potential of a High-data-holding power source for holding the High data as a first potential and uses a potential of a Low-data-holding power source for holding the Low data at any time other than a read operation as a second potential,
    the second potential is higher than a ground potential, and
    a potential of the selected one of the plurality of word lines is a fourth potential lower than a third potential obtained by adding up the second potential and a threshold voltage of each of the access transistors.

2. The semiconductor memory device of claim 1, wherein a potential of the one of the plurality of bit lines which is selected during a write operation is lower than the second potential.

3. The semiconductor memory device of claim 1, wherein
    the potential of the Low-data-holding power source in each of the non-selected memory cells is the second potential, and the potential of the Low-data-holding power source at the memory cell which is selected during reading is lower than the second potential.

4. The semiconductor memory device of claim 1, wherein the potential of the Low-data-holding power source is controlled individually in each of the columns of the matrix, and the potential of the Low-data-holding power source in each of the non-selected columns is the second potential and the potential of the Low-data-holding power source in the column selected during reading is lower than the second potential.

5. The semiconductor memory device of claim 1, wherein a potential of the non-selected one of the plurality of word lines is lower than the second potential.

6. The semiconductor memory device of claim 1, wherein a potential of the selected one of the plurality of word lines is the second potential.

7. The semiconductor memory device of claim 1, wherein the one of the plurality of bit lines which is selected during a write operation, the Low-data-holding power source in the memory cell selected during reading, and each of the non-selected word lines have the same potential.

8. The semiconductor memory device of claim 7, wherein each of a potential of the one of the plurality of bit lines which is selected during the write operation, the potential of the Low-data-holding power source in the memory cell selected during reading, and a potential of each of the non-selected word lines is a ground potential of each of logic transistors other than the transistors of the memory cells in the semiconductor memory device.

9. The semiconductor memory device of claim 1, wherein the threshold voltage of each of the transistors used in the memory cells is the same as a threshold voltage of each of the other logic transistors in the semiconductor memory device.

10. The semiconductor memory device of claim 9, wherein a difference between the first potential and the second potential is smaller than a difference between a potential of a logic power source which is a power source for each of the logic transistors and a ground potential for each of the logic transistors, and the first potential is the same as the potential of the logic power source.

11. The semiconductor memory device of claim 1, wherein the threshold voltage of each of the transistors used in the memory cells is lower than a threshold voltage of each of logic transistors other than the transistors of the memory cells in the semiconductor memory device.

12. The semiconductor memory device of claim 11, wherein a difference between the first potential and the second potential is smaller than a difference between a potential of a logic power source as a power source for each of the logic transistors and a ground potential for each of the logic transistors, and the first potential is lower than the potential of the logic power source.

13. The semiconductor memory device of claim 12, wherein a thickness of a gate insulating film of each of the transistors used in the memory cells is smaller than a thickness of a gate insulating film of each of the logic transistors.

14. The semiconductor memory device of claim 11, further comprising:

a High-data-holding-potential supplying transistor for supplying a potential as the High-data-holding power source, wherein the potential of the High-data-holding power source is set using a threshold voltage of the High-data-holding-potential supplying transistor.

15. The semiconductor memory device of claim 1, wherein a precharge potential of each of the plurality of bit lines is the second potential.

16. A semiconductor memory device comprising:

a memory cell array having a plurality of memory cells arranged in a matrix of rows and columns;

a plurality of word lines arranged to correspond to the respective rows of the memory cells; and a plurality of bit lines arranged to correspond to the respective columns of the memory cells, wherein each of the memory cells has two access transistors and two inverters connected in a cross-coupled configuration to hold High data and Low data as a pair, wherein the two access transistors have respective gates connected to the corresponding word lines, respective sources, and respective drains, one of the source and the drain in each of the two access transistors being connected to the bit line and the other being connected to one of outputs of the inverter, each of the memory cells uses a potential of a High-data-holding power source for holding the High data as a first potential and uses a potential of a Low-data-holding power source for holding the Low data at any time other than a read operation period as a second potential, the second potential is higher than a ground potential, and a potential of the selected one of the plurality of word lines has a value obtained by adding a threshold voltage of each of the access transistors to the second potential.

17. The semiconductor memory device of claim 16, further comprising:

a second-potential supplying transistor for supplying the second potential, wherein the second-potential supplying transistor supplies the potential higher than a ground potential of each of logic transistors other than the transistors of the memory cells in the semiconductor memory device by a threshold voltage thereof.

18. The semiconductor memory device of claim 16, wherein a precharge potential of each of the plurality of bit lines is the first potential.

19. The semiconductor memory device of claim 18, wherein a potential of the one of the plurality of bit lines which is selected during a write operation is lower than the potential of the Low-data-holding power source.

20. The semiconductor memory device of claim 19, wherein the potential of the one of the plurality of bit lines which is selected during the write operation is a ground potential of each of logic transistors other than the transistors of the memory cells in the semiconductor memory device.

21. The semiconductor memory device of claim 20, wherein the potential of the Low-data-holding power source in each of the non-selected memory cells is the second potential, and the potential of the Low-data-holding power source when reading from the memory cell is performed is lower than the potential thereof when the memory cell is non-selected.

22. The semiconductor memory device of claim 21, wherein the potential of the Low-data-holding power source when reading from the memory cell is performed is the ground potential.

23. The semiconductor memory device of claim 18, further comprising:

a bit-line precharge circuit for precharging each of the bit lines, wherein the bit-line precharge circuit is constructed to generate a precharge potential from a logic power source as a power source for each of logic transistors other than the transistors of the memory cells in the semiconductor memory device.

24. The semiconductor memory device of claim 23, wherein the bit-line precharge circuit comprises a precharge-potential setting transistor, and the precharge potential of each of the bit lines is set using a threshold voltage of the precharge-potential setting transistor.

25. The semiconductor memory device of claim 18, further comprising:

word line drivers each for charging the corresponding word line to a potential obtained by adding the threshold voltage of each of the access transistors to the second potential, wherein each of the word line drivers is constructed to generate a potential for charging the corresponding word line from a logic power source which is a power source for each of logic transistors other than the transistors of the memory cells in the semiconductor memory device.

26. The semiconductor memory device of claim 25, wherein each of the word line drivers comprises a first transistor having the same threshold voltage as each of the access transistors and a second transistor having the same threshold voltage as each of the logic transistors, and the potential in charging the corresponding word line is set using the threshold voltage of the first transistor and the threshold voltage of the second transistor.

27. The semiconductor memory device of claim 18, further comprising:

Low-data-holding power source lines each for supplying the second potential to the memory cells; and Low-data-holding-power-source control circuits each for charging, to the second potential, the corresponding Low-data-holding power source line from a logic power source which is a power source for each of logic transistors other than the transistors of the memory cells in the semiconductor memory device.

28. The semiconductor memory device of claim 27, wherein each of the Low-data-holding-power-source control circuits comprises a charge-potential setting transistor connected to the corresponding Low-data-holding power source line, and a charge potential of each of the Low-data-holding power source lines is set using a threshold of the charge-potential setting transistor.

29. The semiconductor memory device of claim 27, wherein each of the Low-data-holding-power-source control circuits charges the corresponding Low-data-holding power source line from the logic power source and then disconnects the Low-data-holding power source line from the logic power source, while connecting the Low-data-holding power source line to a power source for supplying the second potential.

30. A semiconductor memory device comprising:

a memory cell array having a plurality of memory cells arranged in a matrix of rows and columns;

a plurality of word lines arranged to correspond to the respective rows of the memory cells;

a plurality of bit lines arranged to correspond to the respective columns of the memory cells;

a plurality of Low-data-holding-power-source control circuits arranged to correspond to the respective columns of the memory cells;

a plurality of bit-line precharge circuits arranged to correspond to the respective columns of the memory cells;

a plurality of write control circuits arranged to correspond to the respective columns of the memory cells; and a plurality of word line drivers arranged to correspond to the respective rows of the memory cells, wherein each of the memory cells has two access transistors and two inverters connected in a cross-coupled configuration to hold High data and Low data as a pair, wherein the two access transistors have respective gates connected to the corresponding word lines, respective sources, and respective drains, one of the source and the drain in each of the two access transistors being connected to the bit line and the other being connected to one of outputs of the inverter, High-data-holding transistors of the two inverters have respective sources each connected to a High-data-holding power source for holding the High data, while Low-data-holding transistors of the two inverts have respective sources connected to a plurality of Low-data-holding power sources each for holding the Low data which are provided individually to correspond to the respective columns of the memory cells, each of the Low-data-holding power source control circuits has means for supplying a ground potential and a virtual ground potential higher than the ground potential to the Low-data-holding power source in the corresponding column of the memory cell array, each of the bit-line precharge circuits has means for supplying the virtual ground potential to the bit line in the corresponding column of the memory cell array, and each of the write control circuits has means for supplying the ground potential to the bit line in the corresponding column of the memory cell array, wherein when the memory cells are non-selected, each of the Low-data-holding-power-source control circuits supplies the virtual ground potential to the corresponding Low-data-holding power source, while each of the precharge circuits supplies the virtual ground potential to the corresponding bit line, during writing to one of the memory cells, the write control circuit corresponding to the selected column supplies the ground potential to the selected bit line, and during reading from one of the memory cells, the Low-data-holding-power-source control circuit corresponding to the selected column supplies the ground potential to the selected Low-data-holding power source.

31. The semiconductor memory device of claim 30, wherein each of the word line drivers supplies the ground potential to the corresponding word line during a non-selection period and supplies the virtual ground potential to the corresponding word line during a selection period.

32. The semiconductor memory device of claim 30, wherein the High-data-holding power source is connected to a drain of a transistor connected to a logic power source other than the transistors of the memory cell array and has a potential lower by a threshold voltage of the transistor.

33. The semiconductor memory device of claim 30, wherein the Low-data-holding power source is connected to a drain of a transistor connected to the ground potential and has a potential higher by a threshold voltage of the transistor.

* * * * *